(12) United States Patent
Kim et al.

(10) Patent No.: US 11,335,757 B2
(45) Date of Patent: May 17, 2022

(54) ORGANIC LIGHT EMITTING DISPLAY DEVICE

(71) Applicant: LG Display Co., Ltd., Seoul (KR)

(72) Inventors: Aram Kim, Suwon-si (KR); JaeHoon Park, Goyang-si (KR); YoungJang Lee, Paju-si (KR); SeonYeong Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/985,081

(22) Filed: Aug. 4, 2020

(65) Prior Publication Data

US 2021/0043709 A1    Feb. 11, 2021

(30) Foreign Application Priority Data

Aug. 7, 2019    (KR) .................... 10-2019-0096286

(51) Int. Cl.
- *G09G 3/3233* (2016.01)
- *G09G 3/3266* (2016.01)
- *H01L 27/32* (2006.01)

(52) U.S. Cl.
CPC ....... *H01L 27/3272* (2013.01); *G09G 3/3233* (2013.01); *G09G 3/3266* (2013.01);
(Continued)

(58) Field of Classification Search
CPC ............... G09G 3/3233; G09G 3/3266; G09G 2300/0814; G09G 2300/0819;
(Continued)

(56) References Cited

U.S. PATENT DOCUMENTS

| 9,257,493 B2 * | 2/2016 | Lee ..................... H01L 27/32 |
| 2003/0111966 A1 * | 6/2003 | Mikami ............... G09G 3/3266 315/169.3 |

(Continued)

FOREIGN PATENT DOCUMENTS

| CN | 101611499 A | 12/2009 |
| CN | 103681751 A | 3/2014 |

(Continued)

OTHER PUBLICATIONS

Chinese Office Action, dated Dec. 3, 2021, for Chinese Application No. 202010748942.3, 9 pages. (with English Translation).

*Primary Examiner* — Vijay Shankar
(74) *Attorney, Agent, or Firm* — Seed IP Law Group LLP

(57) ABSTRACT

The pixel circuit which controls the driving of the organic light emitting diode includes a driving TFT which supplies a driving current to the organic light emitting diode; a sampling TFT which samples a threshold voltage of the driving TFT; a first initializing TFT which supplies an initialization voltage to one electrode of the organic light emitting diode; and a storage capacitor which stores a voltage applied to the driving TFT, and at least one of the driving TFT, the sampling TFT, and the first initializing TFT includes a shielding electrode disposed between the substrate and the active layer. Therefore, even though the external light is irradiated onto a transparent substrate, a full white gray-level and a full black gray-level can be expressed so that the gray-level expressiveness may not be degraded.

20 Claims, 40 Drawing Sheets

(52) U.S. Cl.
CPC ............... *G09G 2300/0842* (2013.01); *G09G 2310/027* (2013.01); *G09G 2380/10* (2013.01)

(58) Field of Classification Search
CPC ..... G09G 2300/0842; G09G 2310/027; G09G 2380/10; G09G 3/3208; G09G 3/3258; G09G 3/3291; G09G 2330/021; G09G 3/2007; G09G 2310/06; G09G 2320/04; H01L 27/3248; H01L 27/3272
See application file for complete search history.

(56) References Cited

U.S. PATENT DOCUMENTS

| | | |
|---|---|---|
| 2010/0110096 A1 | 5/2010 | Satoh et al. |
| 2014/0084286 A1 | 3/2014 | Jeon et al. |
| 2014/0151708 A1 | 6/2014 | Jeon et al. |
| 2014/0167009 A1* | 6/2014 | Lee ............... H01L 23/5225 257/40 |
| 2015/0311351 A1 | 10/2015 | Seko et al. |
| 2018/0175135 A1 | 6/2018 | Lim et al. |
| 2019/0197965 A1 | 6/2019 | Park et al. |
| 2020/0212275 A1* | 7/2020 | Choi ............... H01L 27/3258 |
| 2021/0043709 A1* | 2/2021 | Kim ................ H01L 27/3272 |

FOREIGN PATENT DOCUMENTS

| | | |
|---|---|---|
| CN | 103855225 A | 6/2014 |
| CN | 105006486 A | 10/2015 |
| CN | 105321957 A | 2/2016 |
| CN | 108206203 A | 6/2018 |
| CN | 108681165 A | 10/2018 |
| CN | 109979387 A | 7/2019 |
| CN | 110061034 A | 7/2019 |
| KR | 20030068420 A | 8/2003 |

\* cited by examiner

ORGANIC LIGHT EMITTING DISPLAY DEVICE

CROSS-REFERENCE TO RELATED APPLICATIONS

This application claims the priority of Korean Patent Application No. 10-2019-0096286 filed on Aug. 7, 2019, in the Korean Intellectual Property Office, the disclosure of which is incorporated herein by reference.

BACKGROUND

Technical Field

The present disclosure relates to an organic light emitting display device, and more particularly, to a transparent organic light emitting display device.

Description of the Related Art

Recently, as it enters an information era, a display field which visually expresses electrical information signals has been rapidly developed and in response to this, various display devices having excellent performances such as thin-thickness, light weight, and low power consumption have been developed.

Specific examples of such a display device include a liquid crystal display device (LCD), a field emission display device (FED), and an organic light emitting display device (OLED).

Each of a plurality of pixels which configures an organic light emitting display device (OLED) includes an organic light emitting diode configured by an organic light emitting layer between an anode and a cathode and a pixel circuit which independently drives the organic light emitting diode. The pixel circuit includes a switching thin film transistor (hereinafter, abbreviated as a TFT), a driving TFT, and a capacitor. Here, the switching TFT charges a data voltage to the capacitor in response to a scan pulse and the driving TFT controls a driving current amount which is supplied to the organic light emitting diode (OD) in accordance with a data voltage charged in the capacitor to adjust an emission amount of the organic light emitting diode.

Recently, in order to implement a head up display (HUD) for a vehicle, a transparent organic light emitting display device (transparent OLED) is being developed. Transparent substrates may be applied to both an upper substrate and a lower substrate of the transparent OLED.

BRIEF SUMMARY

The inventors have realized that according to the conventional art, when the transparent substrate is applied to the organic light emitting display device (OLED), external light such as sunlight may be irradiated onto a plurality of TFTs included in the pixel circuit through the transparent substrate. Specifically, external light may be irradiated onto a respective active layer of the plurality of TFTs through the transparent substrate.

When external light is irradiated to the respective active layer of the plurality of TFTs, a light leakage current is generated in the active layer of the plurality of TFTs. This further causes to change an S-factor of the plurality of TFTs and a threshold voltage of the plurality of TFTs. As a result, a gray-level expressiveness of the organic light emitting display device (OLED) may be degraded. Further, a driving current at a start timing and a driving current at an end timing are changed in one frame so that even in one frame, a constant gray-level cannot be expressed. Based on the inventors work in fully locating and appreciating these issues, they have proposed solutions as described herein.

The present disclosure provides an organic light emitting display device that includes a transparent substrate but that blocks a light leakage current of a plurality of TFTs. In addition, a transparent organic light emitting display device according to the present disclosure maintains a constant gray-level in one frame. This is made possible because a driving current at a start timing and a driving current at an end timing are not changed in the frame.

Other benefits of the present disclosure will be readily understood by those skilled in the art and other benefits not mentioned above would will be understood by those skilled in the art from the following descriptions.

In one or more embodiments, an organic light emitting display device includes a display panel including a plurality of pixels disposed on a substrate, and each of the plurality of pixels includes an organic light emitting diode and a pixel circuit which controls the driving of the organic light emitting diode. The pixel circuit includes: a driving TFT which supplies a driving current to the organic light emitting diode; a sampling TFT which samples a threshold voltage of the driving TFT; a first initializing TFT which supplies an initialization voltage to one electrode of the organic light emitting diode; and a storage capacitor which stores a voltage applied to the driving TFT, and at least one of the driving TFT, the sampling TFT, and the first initializing TFT includes a shielding electrode disposed between the substrate and the respective active layer of the various transistors. Therefore, even though the external light is irradiated onto a transparent substrate, a full white gray-level and a full black gray-level can be expressed so that the gray-level expressiveness may not be degraded.

In one or more embodiments, an organic light emitting display device includes an organic light emitting diode formed over a substrate and a pixel circuit which controls the driving of the organic light emitting diode. The pixel circuit includes: a driving TFT which is connected to one electrode of the organic light emitting diode; a switching TFT which is connected to a gate electrode of the driving TFT and a data line; and an initializing TFT which is connected to one electrode of the organic light emitting diode and an input terminal of an initialization voltage. At least one of the driving TFT, the switching TFT, and the initializing TFT includes a gate electrode disposed above the active layer and a shielding electrode disposed below the active layer. Therefore, even though external light is irradiated, a gray-level expressed for one frame may be constantly maintained.

Other detailed matters of the embodiments are included in the detailed description and the drawings.

According to the organic light emitting display device of the present disclosure, the shielding electrode is disposed between the transparent substrate and the active layer to block a light leakage current of the plurality of TFTs. Accordingly, in the organic light emitting display device of the present disclosure, a change in an S-factor of the plurality of TFTs and a change in a threshold voltage of the plurality of TFTs are suppressed to enhance a gray-level expressiveness.

According to the organic light emitting display device of the present disclosure, the shielding electrode is disposed between the transparent substrate and the active layer to stably maintain a gray-level expressed for one frame.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
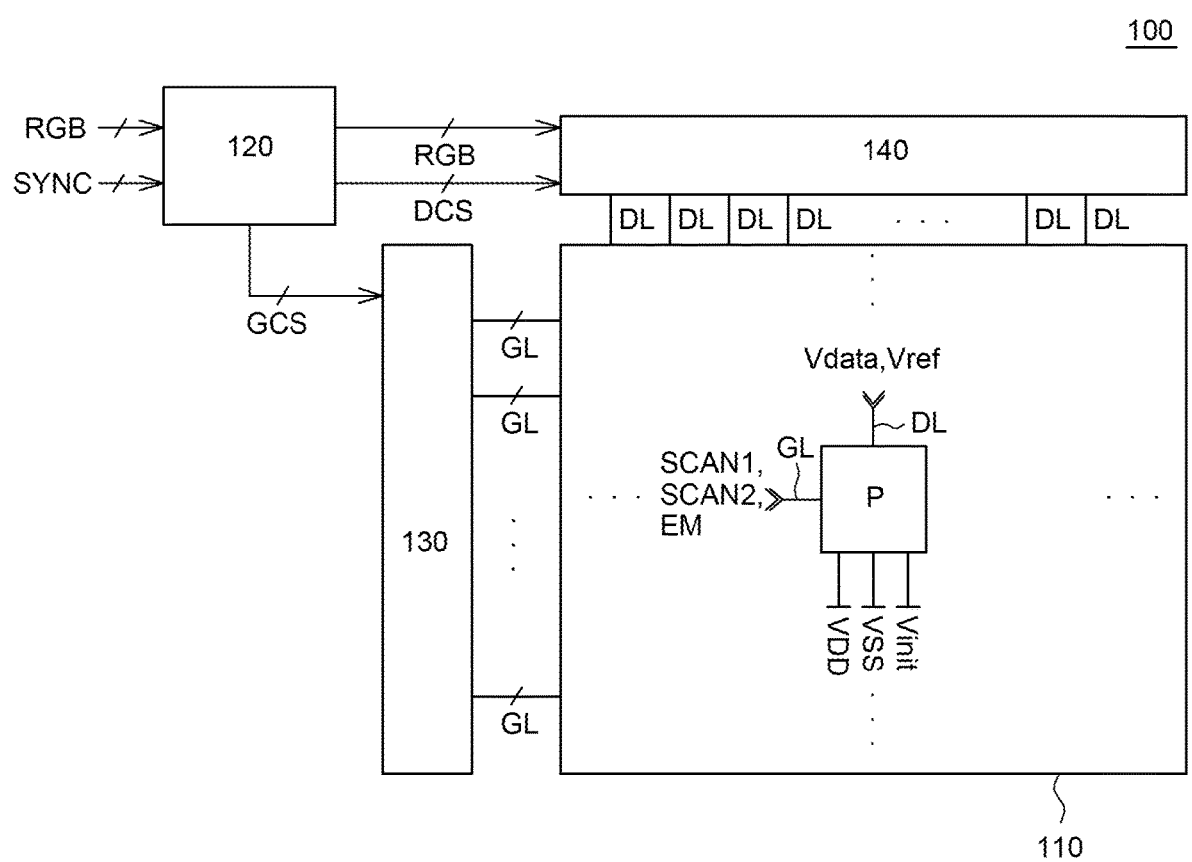
FIG. 1 is a schematic block diagram for explaining an organic light emitting display device according to one or more embodiments of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an organic light emitting display device according to embodiments of the present disclosure will be described in detail with reference to accompanying drawings.

Organic Light Emitting Display Device

FIG. 1 is a schematic block diagram for explaining an organic light emitting display device according to one or more embodiments of the present disclosure.

Referring to FIG. 1, an organic light emitting display device 100 includes a display panel 110 including a plurality of pixels P connected to gate lines GL and data lines DL, a gate driver 130 which supplies gate signals to the gate lines GL, a data driver 140 which supplies data signals to the data lines DL, and a timing controller 120 which controls the gate driver 130 and the data driver 140.

The timing controller 120 processes image data RGB input from the outside to be suitable for a size and a resolution of the display panel 110 to supply the processed image data to the data driver 140. Further, the timing controller 120 generates a plurality of gate control signals GCS and a plurality of data control signals DCS using synchronization signals input from the outside, for example, a dot clock signal DCLK, a data enable signal DE, a horizontal synchronization signal Hsync, and a vertical synchronization signal Vsync. The plurality of generated gate and data control signals GCS and DCS is supplied to the gate driver 130 and the data driver 140, respectively, to control the gate driver 130 and the data driver 140.

The gate driver 130 supplies the gate signals to the gate lines GL in accordance with the gate control signal GCS supplied from the timing controller 120. Here, the gate signal includes a first scan signal SCAN1, a second scan signal SCAN2, and an emission control signal EM. Even though in FIG. 1, it is illustrated that the gate driver 130 is disposed to be spaced apart from one side of the display panel 110, the number of the gate drivers 130 and an arrangement position thereof are not limited thereto. That is, the gate driver 130 may be disposed at one side or both sides of the display panel 110 in a gate in panel (GIP) manner.

The data driver 140 converts image data RGB into a data voltage Vdata in accordance with the data control signal DCS supplied from the timing controller 120 and supplies the converted data voltage Vdata to the pixel P through the data line DL.

In the display panel 110, the plurality of gate lines GL and the plurality of data lines DL intersect each other and each of the plurality of pixels P is connected to the gate lines GL and the data line DL, respectively.

Here, one pixel P is supplied with a gate signal from the gate driver 130 through the gate line GL, is supplied with a data signal from the data driver 140 through the data line DL, and is supplied with various powers through a power supply line.

Specifically, one pixel P receives the first scan signal SCAN1, the second scan signal SCAN2, and the emission control signal EM through the gate line GL. One pixel P receives the data voltage Vdata through the data line DL, and receives a high potential voltage VDD, a low potential voltage VSS, and an initialization voltage Vinit through the power supply line.

Transmission Area and Emission Area

Figure 2A:
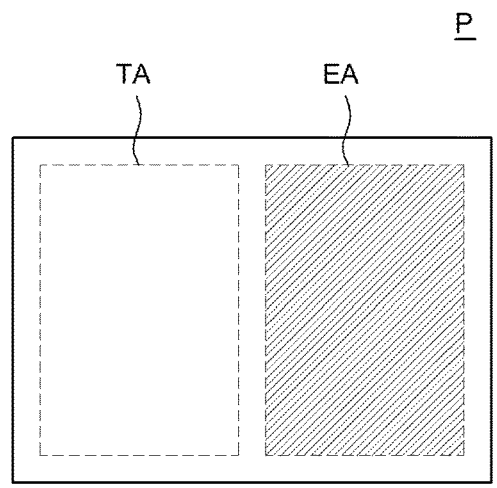
FIG. 2A is a schematic block diagram for explaining a transmission area and an emission area included in a pixel of an organic light emitting display device according to one or more embodiments of the present disclosure.
Figure 2B:
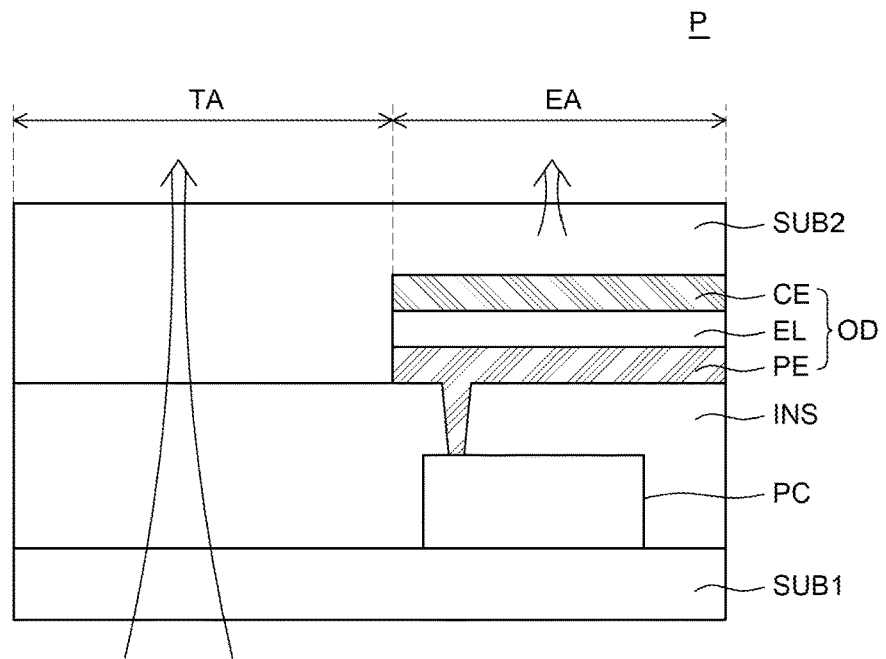
FIG. 2B is a cross-sectional view for explaining a transmission area and an emission area included in a pixel of an organic light emitting display device according to one or more embodiments of the present disclosure.
Figure 2B:
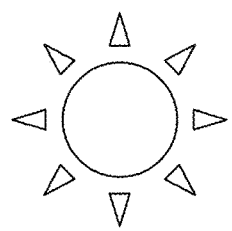

FIG. 2A is a schematic block diagram for explaining a transmission area and an emission area included in a pixel of an organic light emitting display device according to one or more embodiments of the present disclosure. FIG. 2B is a cross-sectional view for explaining a transmission area and an emission area included in a pixel of an organic light emitting display device according to one or more embodiments of the present disclosure.

An organic light emitting display device 100 according to one or more embodiments of the present disclosure may be a transparent organic light emitting display device (transparent OLED).

Accordingly, as illustrated in FIG. 2A, each pixel P may include an emission area EA where light is emitted and a transmission area TA where light is transmitted.

Specifically, the transmission area TA transmits light so as to allow the display panel 110 to have transparency and the emission area EA which displays information in an upward direction of the display panel 110 is controlled by the gate signal and the data signal which are applied to the pixel P to emit light.

Referring to FIG. 2B, in the transmission area TA, a first transparent substrate SUB1, a transparent insulating layer INS, and a second transparent substrate SUB2 are sequentially laminated.

The above-described first transparent substrate SUB1 and second transparent substrate SUB2 may be formed not only of a glass substrate, but also of a plastic substrate such as polyethylene terephthalate (PET), polyethylene naphthalate (PEN), or polyimide. Further, the transparent insulating layer INS may be formed as a single layer of silicon nitride (SiNx) or silicon oxide (SiOx) or a multilayer thereof. Therefore, since transparent materials are disposed in the transmission area TA, external light may be transmitted through the transmission area TA.

For example, in one embodiment, only transparent materials are disposed in the transmission area TA and external light may be effectively transmitted through the transmission area TA.

Further, in the emission area EA, a first transparent substrate SUB1, a pixel circuit PC, a transparent insulating layer INS, an organic light emitting diode OD, and a second transparent substrate SUB2 are sequentially laminated. The organic light emitting diode OD is configured by a pixel electrode PE, a cathode CE, and an organic light emitting layer EL between the pixel electrode PE and the cathode CE. The pixel circuit PC includes a plurality of switching TFTs, driving TFTs, and capacitors. Further, the organic light emitting diode OD is electrically connected to the pixel circuit PC through a contact hole formed in the insulating layer INS to be applied with a gate signal and a data signal.

Therefore, in the pixel circuit PC, the driving TFT controls a current amount supplied to the organic light emitting diode OD in accordance with the data voltage Vdata charged in the capacitor to control an emission amount of the organic light emitting diode OD. The switching TFT receives the scan signals SCAN1 and SCAN2 supplied through the gate line GL to charge the data voltage Vdata to the capacitor.

Further, the pixel electrode PE, the cathode CE, and the pixel circuit PC disposed in the emission area EA may be configured not only by an opaque metal, but also by a translucent metal or a transparent metal.

Therefore, in the emission area EA, external light may be completely blocked, but it is not limited thereto, and external light may be partially transmitted depending on the necessity of design.

Hereinafter, an example that the organic light emitting display device according to the some embodiments of the present disclosure includes a 6T1C (six transistor, one capacitor) pixel circuit PC will be described in detail with reference to FIG. 3.

<Structure of 6T1C Pixel Circuit>

Figure 3:
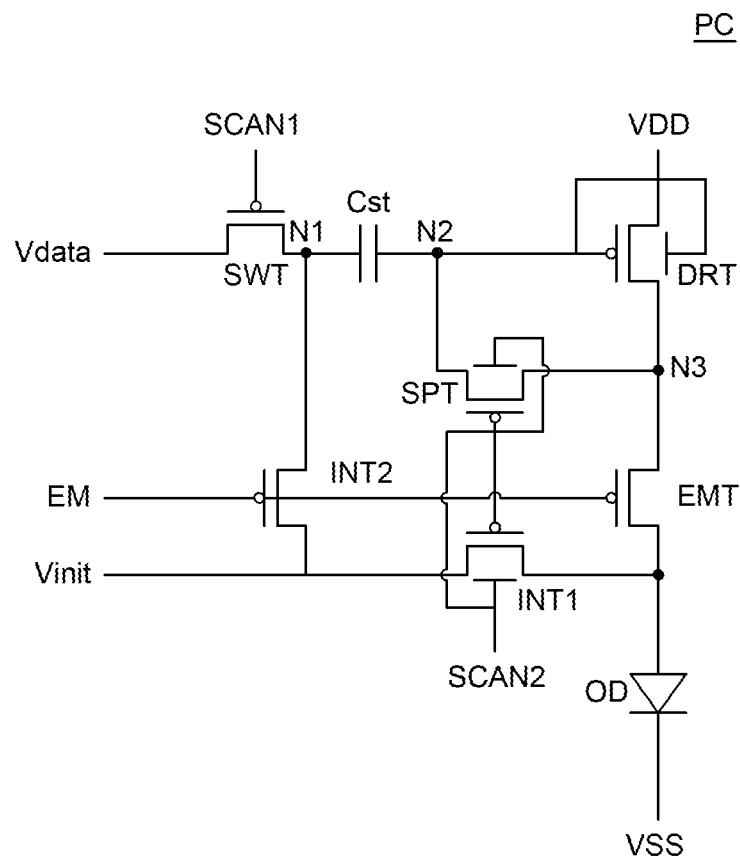
FIG. 3 is a circuit diagram illustrating a 6T1C pixel circuit equipped in an organic light emitting display device according to one or more embodiments of the present disclosure.

FIG. 3 is a circuit diagram illustrating a 6T1C pixel circuit equipped in an organic light emitting display device according to one or more embodiments of the present disclosure.

For reference, even though in FIG. 3, the plurality of TFTs is n-type TFTs, the present disclosure is not limited thereto and the plurality of TFTs may be p-type TFTs.

Referring to FIG. 3, a pixel circuit PC according to one or more embodiments of the present disclosure includes a driving TFT DRT, a switching TFT SWT, a sampling TFT SPT, an emission control TFT EMT, a first initializing transistor INT1, a second initializing transistor INT2, and a storage capacitor Cst.

The driving TFT DRT controls a driving current which is supplied to the organic light emitting diode OD.

The driving TFT DRT may include a source electrode, an active layer, a drain electrode, a gate electrode, and a shielding electrode. Specifically, in the driving TFT DRT, the source electrode is connected to a high potential voltage VDD input terminal, the drain electrode is connected to a third node N3, the gate electrode is connected to a second node N2, and a shielding electrode is connected to the gate electrode.

Therefore, a driving current supplied to the organic light emitting diode OD is controlled in accordance with a gate-source voltage Vgs of the driving TFT DRT to control a luminance of the organic light emitting diode OD in accordance with a driving current amount.

The switching TFT SWT applies a data voltage Vdata supplied from the data line to a first node N1.

The switching TFT SWT may include a source electrode, an active layer, a drain electrode, and a gate electrode. Specifically, in the switching TFT SWT, a data voltage Vdata is input to the source electrode, the drain electrode is connected to the first node N1, and a first scan signal SCAN1 is input to the gate electrode.

Therefore, the switching TFT SWT applies a data voltage Vdata supplied from the data line to the first node N1 in response to the first scan signal SCAN1.

The sampling TFT SPT samples a threshold voltage Vth of the driving TFT DRT.

The sampling TFT SPT may include a source electrode, an active layer, a drain electrode, a gate electrode, and a shielding electrode. Specifically, in the sampling TFT SPT, the source electrode is connected to the third node N3, the drain electrode is connected to the second node N2, the second scan signal SCAN2 is input to the gate electrode, and the shielding electrode is connected to the gate electrode.

Therefore, the sampling TFT SPT electrically connects the second node N2 and the third node N3 in response to the second scan signal SCAN2 to establish diode connection of the gate electrode and the drain electrode of the driving TFT DRT. Therefore, the sampling TFT SPT raises the voltage of the second node N2 in accordance with the voltage of the third node N3. As the voltage of the second node N2 rises, a difference of gate-source voltages Vgs of the driving TFT DRT is gradually reduced. When the difference of gate-source voltages of the driving TFT DRT is equal to or lower than a threshold voltage Vth, the driving TFT DRT is turned off. According to the above-described process, the sampling TFT SPT may sample the threshold voltage Vth of the driving TFT DRT.

The emission control TFT EMT controls the emission of the organic light emitting diode OD.

The emission control TFT EMT may include a source electrode, an active layer, a drain electrode, and a gate electrode. Specifically, in the emission control TFT EMT, the source electrode is connected to the third node N3, the drain electrode is connected to the organic light emitting diode OD, and the emission control signal EM is input to the gate electrode.

Therefore, the emission control TFT EMT forms a current path between the third node N3 and the organic light emitting diode OD in response to the emission control signal EM to control the emission of the organic light emitting diode OD.

The first initializing TFT INT1 applies an initialization voltage Vinit to the organic light emitting diode OD.

The first initializing TFT INT1 may include a source electrode, an active layer, a drain electrode, a gate electrode, and a shielding electrode. Specifically, in the first initializing TFT INT1, the source electrode is connected to an input terminal of the initialization voltage Vinit, the drain electrode is connected to the organic light emitting diode OD, the second scan signal SCAN2 is input to the gate electrode, and the shielding electrode is connected to the gate electrode.

Therefore, the first initializing TFT INT1 applies an initialization voltage Vinit to the organic light emitting diode OD in response to the second scan signal SCAN2.

The second initializing TFT INT2 applies an initialization voltage Vinit to the first node N1.

The second initializing TFT INT2 may include a source electrode, an active layer, a drain electrode, and a gate electrode. Specifically, in the second initializing TFT INT2, the source electrode is connected to the input terminal of the initialization voltage Vinit, the drain electrode is connected to the first node N1, and the emission control signal EM is input to the gate electrode.

Therefore, the second initializing TFT INT2 applies an initialization voltage Vinit to the first node N1 in response to the emission control signal EM.

The storage capacitor Cst stores a voltage applied to the gate node of the driving TFT DRT.

Here, the capacitor Cst is disposed between the first node N1 and the second node N2.

Therefore, the storage capacitor Cst is electrically connected to the first node N1 and the second node N2 to store a difference between a voltage of the gate electrode of the driving TFT DRT and a voltage supplied to the drain electrode of the switching transistor SWT.

As described above, the pixel circuit PC of the organic light emitting display device 100 according to some embodiments of the present disclosure may have a 6T1C structure. Specifically, among the plurality of TFTs, the driving TFT DRT, the sampling TFT SPT, and the first initializing TFT INT1 include the gate electrode and the shielding electrode which are electrically connected with each other.

In the other words, among the plurality of TFTs, the driving TFT DRT, the sampling TFT SPT, and the first initializing TFT INT1 may be dual gate TFTs including the gate electrode and the shielding electrode which are electrically connected with each other.

However, the present disclosure is not limited thereto and any one or more of the driving TFT DRT, the sampling TFT SPT, and the first initializing TFT INT1 may be a dual gate TFT depending on the necessity of design.

By doing this, in the active layer, a front channel layer due to the gate electrode and a back channel layer due to the shielding electrode are formed. That is, in the driving TFT DRT, the sampling TFT SPT, and the first initializing TFT INT1, two stable channel layers may be formed in the active layer. As a result, the turn-on current is stabilized and the S-factor is increased so that the TFT driving characteristic may be improved.

Further, the present disclosure is not merely limited to being implemented by a 6T1C structure (for example, 4T2C structure) and other electronic components besides may be utilized to implement the pixel circuit PC.

Cross-Sectional Structure of TFT

Figure 4A:
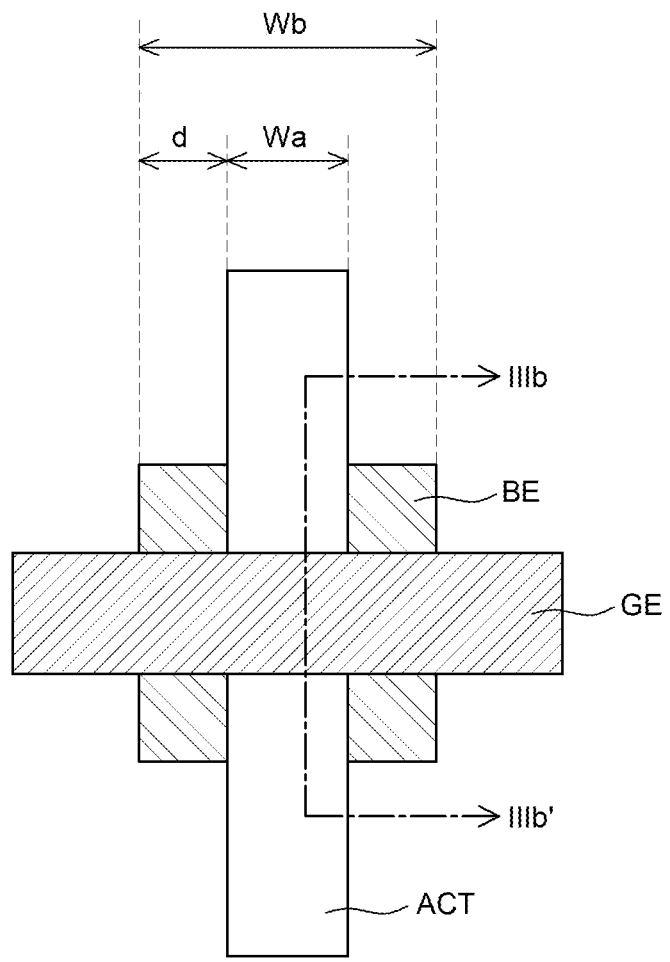
FIG. 4A is a schematic plan view illustrating a gate electrode, an active layer, and a shielding electrode of a driving TFT, a sampling TFT, and a first initializing TFT illustrated in FIG. 3.
Figure 4B:
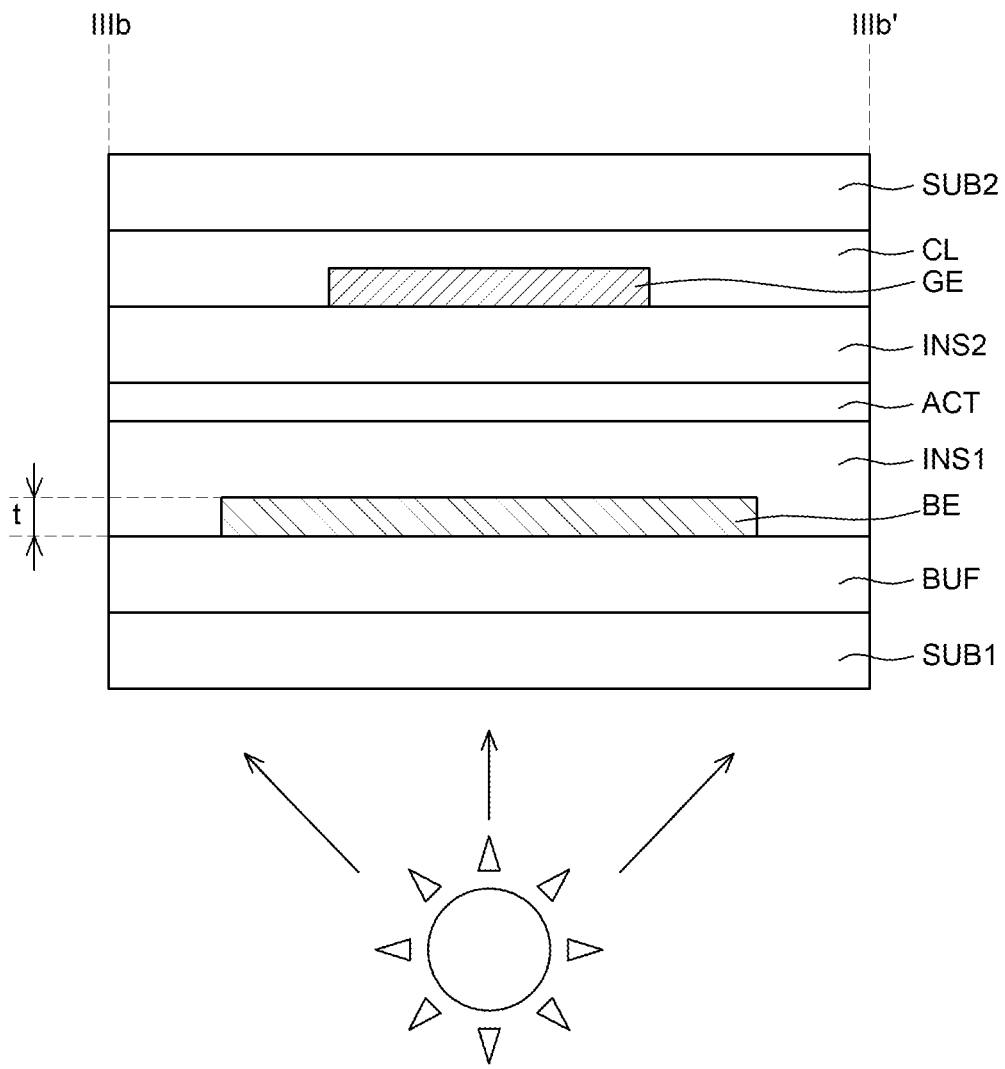
FIG. 4B is a cross-sectional view taken along the line illustrated in FIG. 4A.

FIG. 4A is a schematic plan view illustrating a gate electrode, an active layer, and a shielding electrode of a driving TFT, a sampling TFT, and a first initializing TFT illustrated in FIG. 3. FIG. 4B is a cross-sectional view taken along the line IIIb-IIIb' illustrated in FIG. 4A.

Referring to FIGS. 4A and 4B, a first transparent substrate SUB1 and a buffer layer BUF are disposed below the driving TFT DRT, the sampling TFT SPT, and the first initializing TFT INT1. Further, each of the driving TFT DRT, the sampling TFT SPT, and the first initializing TFT INT1 includes a shielding electrode BE, a first insulating layer INS1, an active layer ACT, a second insulating layer INS2, and a gate electrode GE. Further, a protective layer CL and a second transparent substrate SUB2 are disposed above each of the driving TFT DRT, the sampling TFT SPT, and the first initializing TFT INT1.

That is, the first transparent substrate SUB1, the buffer layer BUF, the shielding electrode BE, the first insulating layer INS1, the active layer ACT, the second insulating layer INS2, the gate electrode GE, the protective layer CL, and the second transparent substrate SUB2 are sequentially disposed from the bottom.

The first transparent substrate SUB1 is disposed below the driving TFT DRT, the sampling TFT SPT, and the first initializing TFT INT1. For example, the first transparent substrate SUB1 may be formed not only of a glass substrate, but also of a plastic substrate such as polyethylene terephthalate (PET), polyethylene naphthalate (PEN), or polyimide.

The buffer layer BUF is disposed above the first transparent substrate SUB1 to block permeation of impurities. For example, the buffer layer BUF may be configured as a single layer of silicon nitride (SiNx) or silicon oxide (SiOx) or a multilayer thereof.

The shielding electrode BE is disposed on the buffer layer BUF. The shielding electrode BE may be formed of at least one of aluminum (Al), platinum (Pt), palladium (Pd), silver (Ag), magnesium (Mg), gold (Au), nickel (Ni), chrome (Cr), molybdenum (Mo), titanium (Ti), and copper (Cu) or an alloy thereof and formed as a single layer or a plurality of layers.

The first insulating layer INS1 is disposed between the shielding electrode BE and the active layer ACT to insulate the shielding electrode BE from the active layer ACT. For example, the first insulating layer INS1 may also be formed as a single layer of silicon nitride (SiNx) or silicon oxide (SiOx) or a multilayer thereof.

In some embodiments, the active layer ACT is disposed adjacent to the gate electrode GE and the shielding electrode BE to form a channel layer through which carriers may move, in the active layer ACT.

In one example, the active layer ACT is disposed between the gate electrode GE and the shielding electrode BE to form a channel layer through which carriers may move, in the active layer ACT.

The active layer ACT may be made of a low temperature poly silicon (hereinafter, simply referred to as LTPS). The polysilicon material has a high mobility (100 cm$^2$/Vs or higher) to have low energy consumption and excellent reliability.

Specifically, in the organic light emitting display device 100 according to the embodiment of the present disclosure, each of the driving TFT DRT, the sampling TFT SPT, and the first initializing TFT INT1 may be a LTPS TFT.

However, the present disclosure is not limited thereto and in the organic light emitting display device 100 according to the embodiment of the present disclosure, the plurality of TFTs may be configured as a multi-type TFT including an oxide semiconductor TFT and an LTPS TFT in various manners.

The second insulating layer INS2 is disposed between the shielding electrode BE and the active layer ACT to insulate the shielding electrode BE from the active layer ACT. For example, the second insulating layer INS2 may also be formed as a single layer of silicon nitride (SiNx) or silicon oxide (SiOx) or a multilayer thereof.

The gate electrode GE is disposed on the second insulating layer INS2. The gate electrode GE may be formed of at least one of aluminum (Al), platinum (Pt), palladium (Pd), silver (Ag), magnesium (Mg), gold (Au), nickel (Ni), chrome (Cr), molybdenum (Mo), titanium (Ti), and copper (Cu) or an alloy thereof and formed as a single layer or a plurality of layers.

The protective layer CL is formed to cover the gate electrode GE. The protective layer CL may be formed of an organic layer or an inorganic layer having hydrophobicity, and for example, may be formed of any one of polystyrene, siloxane series resin, acrylic resin, silicon oxynitride (SiON), silicon nitride (SiNx), silicon oxide (SiOx), and aluminum oxide (AlOx).

The second transparent substrate SUB2 is disposed on the protective layer CL. That is, the second transparent substrate SUB2 may be disposed at a top portion of the organic light emitting display device. For example, the second transparent substrate SUB2 may be formed not only of a glass substrate, but also of a plastic substrate such as polyethylene terephthalate (PET), polyethylene naphthalate (PEN), or polyimide.

Shielding Electrode Serving as Shielding Electrode

As described above, the first transparent substrate SUB1 is disposed at a bottom portion of the organic light emitting display device 100 of the present disclosure. In this case, when external light such as sunlight is incident from a lower part of the first transparent substrate SUB1, the external light such as sunlight may be irradiated onto the plurality of TFTs included in the pixel circuit PC through the first transparent substrate SUB1. Generally, the sunlight may have a high brightness of 100,000 nits.

When external light having the above-described high brightness is directly incident onto the active layer ACT which is configured by LTPS of a plurality of TFTs, a light leakage current may be generated in the plurality of TFTs. However, in the organic light emitting display device according to an embodiment of the present disclosure, the shielding electrode BE is disposed between the first transparent substrate SUB1 and the active layer ACT configured by LTPS. By doing this, external light having a high brightness is not directly incident onto the active layer ACT configured by LTPS of the plurality of TFTs. Therefore, the light leakage current of the plurality of TFTs may be blocked. By doing this, the change of the S-factor of the plurality of TFTs and the change of the threshold voltage of the plurality of TFTs are suppressed, to enhance a gray-level expressiveness.

Hereinafter, a specific shape of the shielding electrode will be described.

Figure 5:
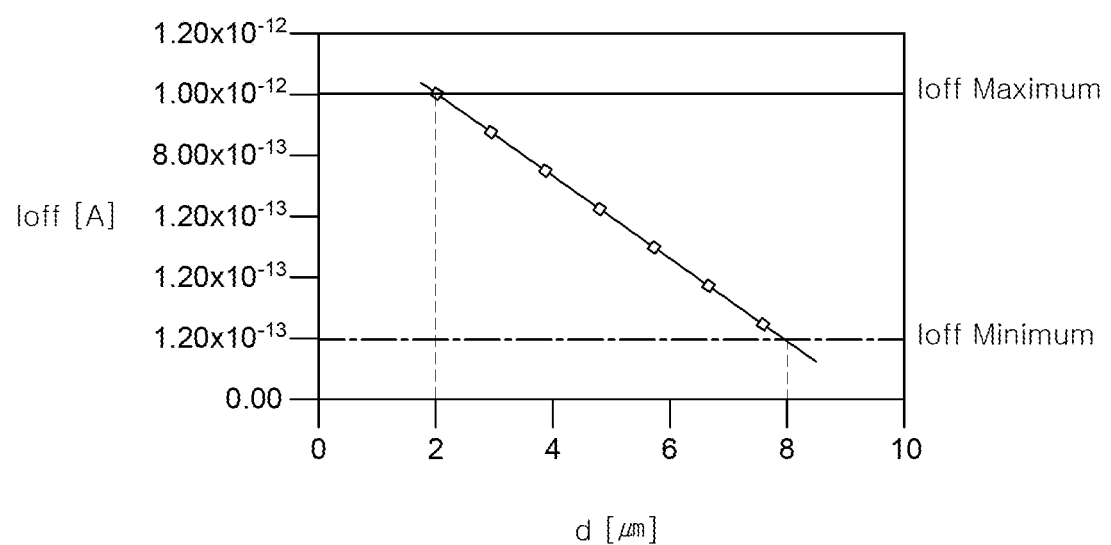
FIG. 5 is a graph illustrating a relationship of an arrangement of a shielding electrode and an off current of a TFT of an organic light emitting display device according to one or more embodiments of the present disclosure.

FIG. 5 is a graph illustrating a relationship of an arrangement of a shielding electrode and an off current of a TFT of an organic light emitting display device according to one or more embodiments of the present disclosure.

As illustrated in FIG. 4A, a width Wb of the shielding electrode BE may be larger than a width Wa of the active layer ACT. As described above, the shielding electrode BE is disposed below the active layer ACT and the width Wb of the shielding electrode BE is larger than the width Wa of the active layer ACT so that external light irradiated from the lower part may be effectively shielded.

Specifically, a distance d between an end of the shielding electrode BE and an end of the active layer ACT may be 2 μm to 8 μm.

In FIG. 5, an x-axis represents a distance between the end of the shielding electrode BE and the end of the active layer ACT and a y-axis represents an off current Ioff of the TFT. That is, FIG. 5 is a graph obtained by measuring an off current Ioff of the TFT while changing a distance d between the end of the shielding electrode BE and the end of the active layer ACT by changing the width Wb of the shielding electrode BE when external light is irradiated from a lower part of the first transparent substrate SUB1.

Specifically, in FIG. 5, the larger than width Wb of the shielding electrode BE, the larger the distance d between the end of the shielding electrode BE and the end of the active layer ACT. Therefore, as the distance d getting larger, it is confirmed that a photo current of the active layer ACT is reduced so that the off current Ioff of the TFT is reduced.

In the meantime, generally, in order to express a black gray-level which is a lowest gray-level, an off current Ioff of $1.00 \times 10^{-12}$ A or lower needs to be supplied. Further, even though the off current Ioff of $2.00 \times 10^{-13}$ A or lower is supplied, a viewer does not recognize a difference in a gray-level.

Therefore, in order to represent a black gray-level which is the lowest gray-level, an off current Ioff of $2.00 \times 10^{-13}$ A to $1.00 \times 10^{-12}$ A needs to flow.

When the distance d between the end of the shielding electrode BE and the end of the active layer ACT is 2 μm to 8 μm, an off current Ioff of $2.00 \times 10^{-13}$ A to $1.00 \times 10^{-12}$ A may flow in the TFT.

Therefore, the distance d between the end of the shielding electrode BE and the end of the active layer ACT is set to be 2 μm to 8 μm, to express a black gray-level which is the lowest gray-level even though external light is irradiated from the lower part of the first transparent substrate SUB1.

Further, as illustrated in FIG. 4B, a thickness t of the shielding electrode BE may be 1,000 Å to 2,000 Å.

With regard to this, when the thickness of the shielding electrode BE is lower than 1,000 Å, the external light may transmit via the shielding electrode BE. That is, when the thickness of the shielding electrode BE is lower than 1,000 Å, the shielding electrode BE may not serve as a shielding electrode BE.

Further, when the thickness of the shielding electrode BE exceeds 2,000 Å, the active layer ACT disposed over the shielding electrode BE is highly likely to be disconnected due to the large thickness of the shielding electrode BE.

As a result, by forming the thickness of the shielding electrode BE to be 1,000 Å to 2,000 Å, an element reliability of the plurality of TFTs may be achieved and the shielding electrode BE effectively performs a light shielding function to block the light leakage current of the plurality of TFTs. By doing this, the change of the S-factor of the plurality of TFTs and the change of the threshold voltage of the plurality of TFTs are suppressed, to enhance a gray-level expressiveness.

Comparison of Graph Obtained by Measuring Gamma Curve and Holding Ratio

Figure 6A:
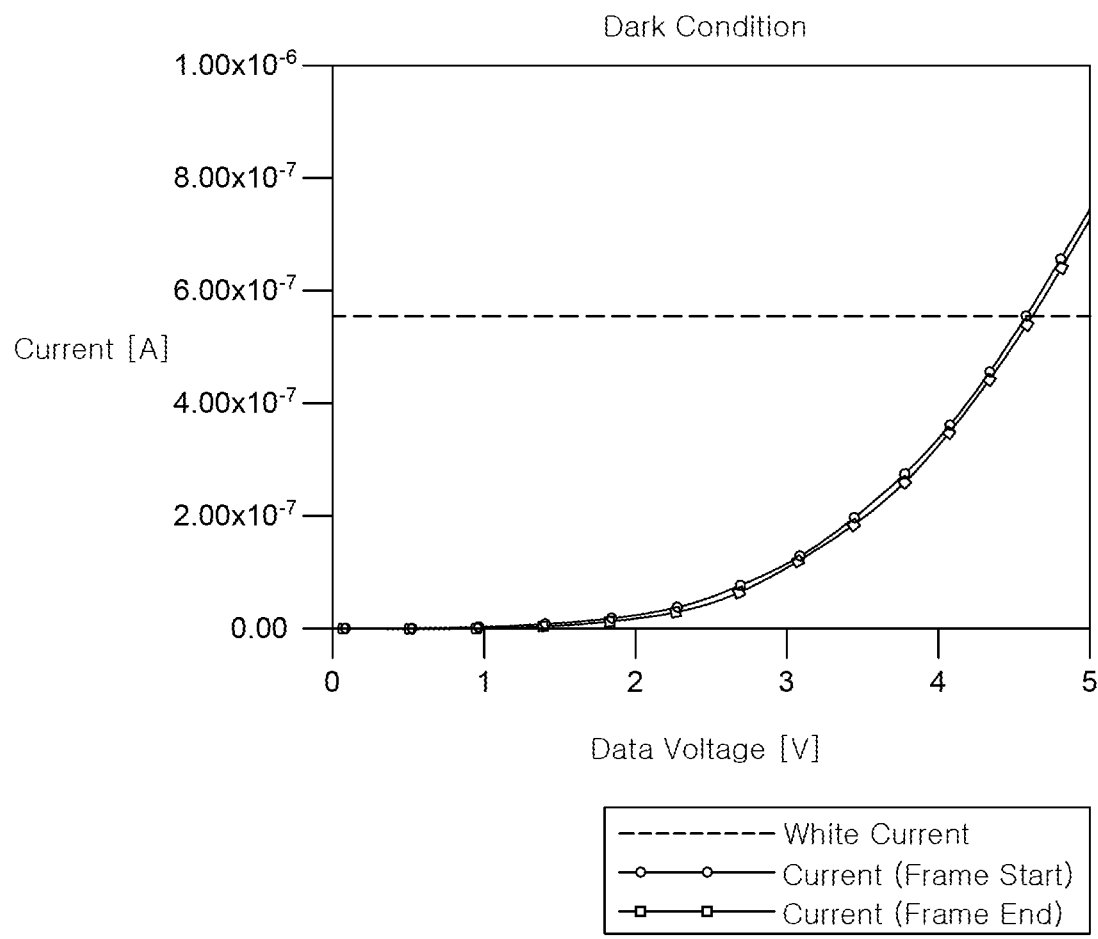
FIG. 6A is a graph illustrating a gamma curve when a shielding electrode is not applied to a plurality of TFTs and external light is not irradiated.
Figure 6B:
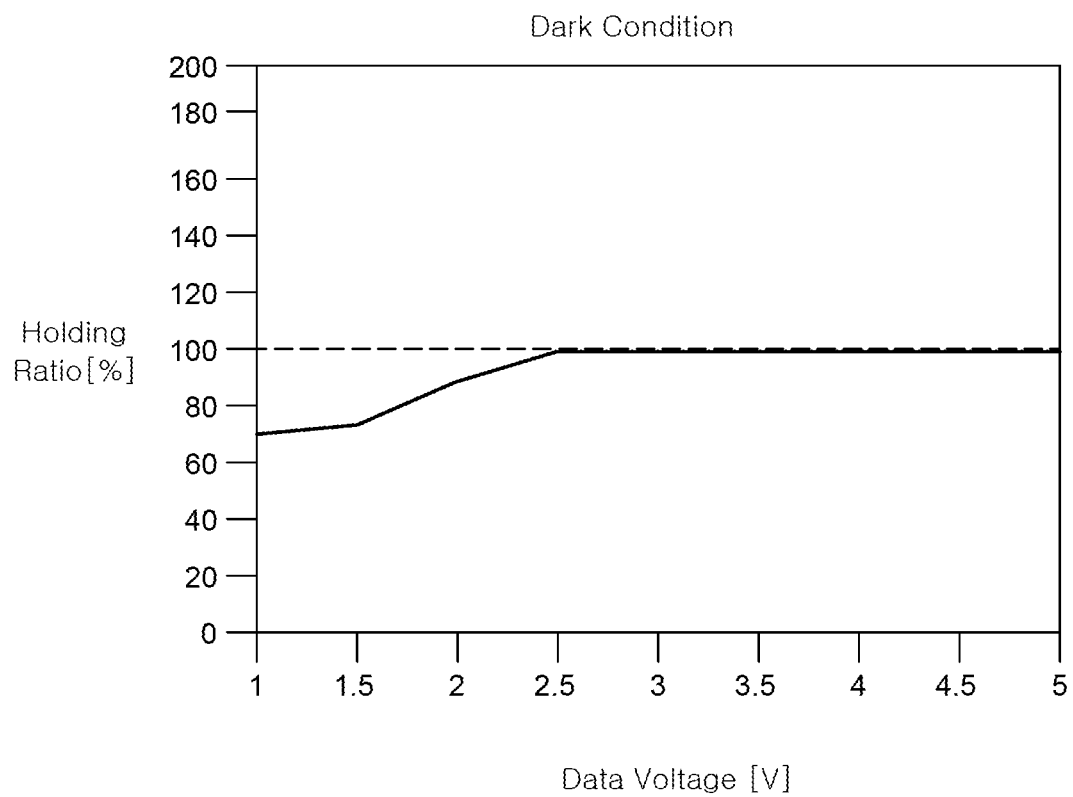
FIG. 6B is a graph illustrating a holding ratio when a shielding electrode is not applied to a plurality of TFTs and external light is not irradiated.
Figure 6C:
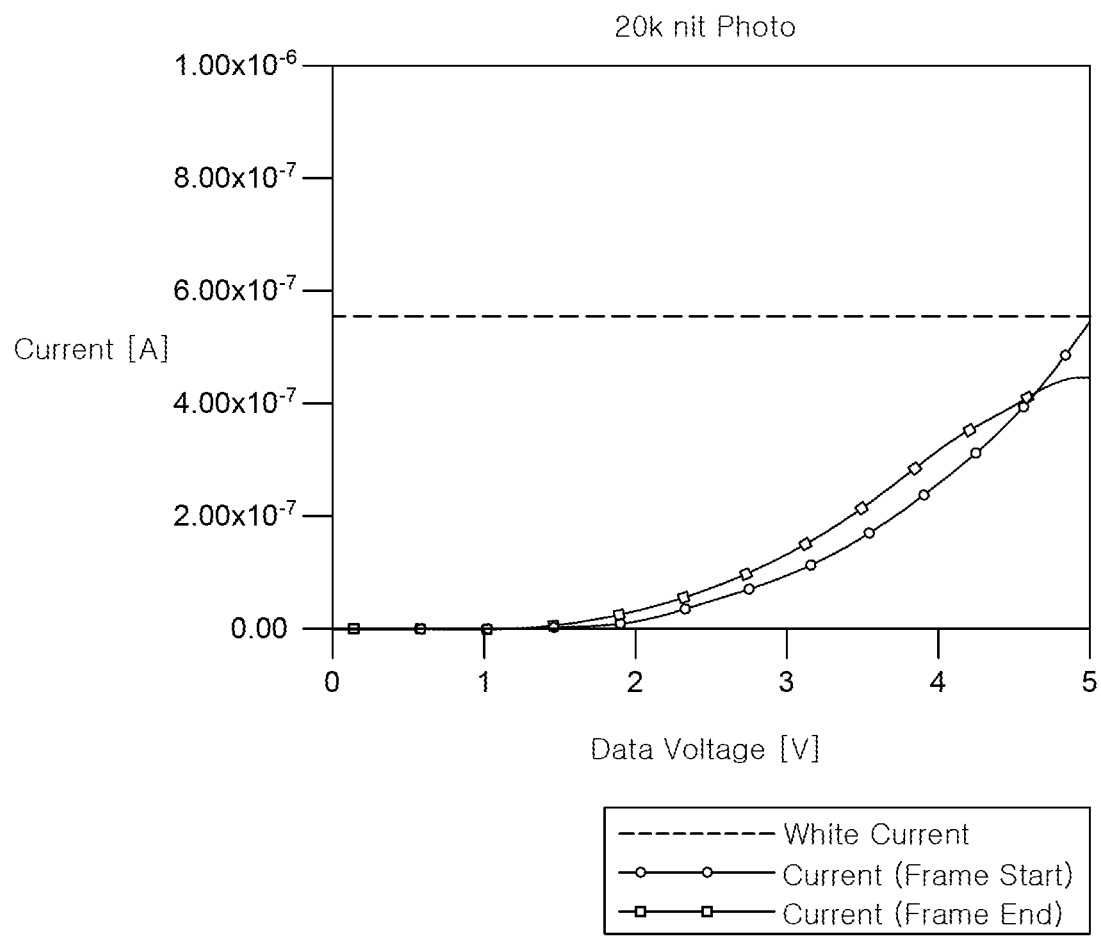
FIG. 6C is a graph illustrating a gamma curve when a shielding electrode is not applied to a plurality of TFTs and external light of 20,000 nits is irradiated.
Figure 6D:
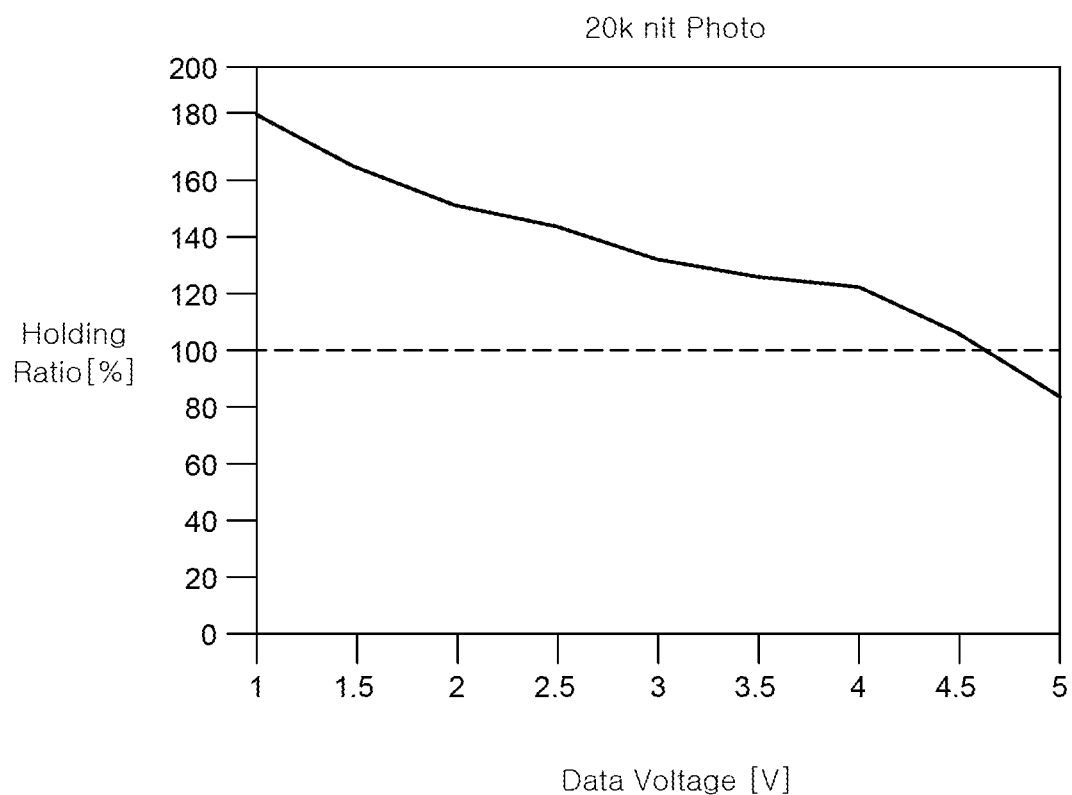
FIG. 6D is a graph illustrating a holding ratio when a shielding electrode is not applied to a plurality of TFTs and external light of 20,000 nits is irradiated.
Figure 6E:
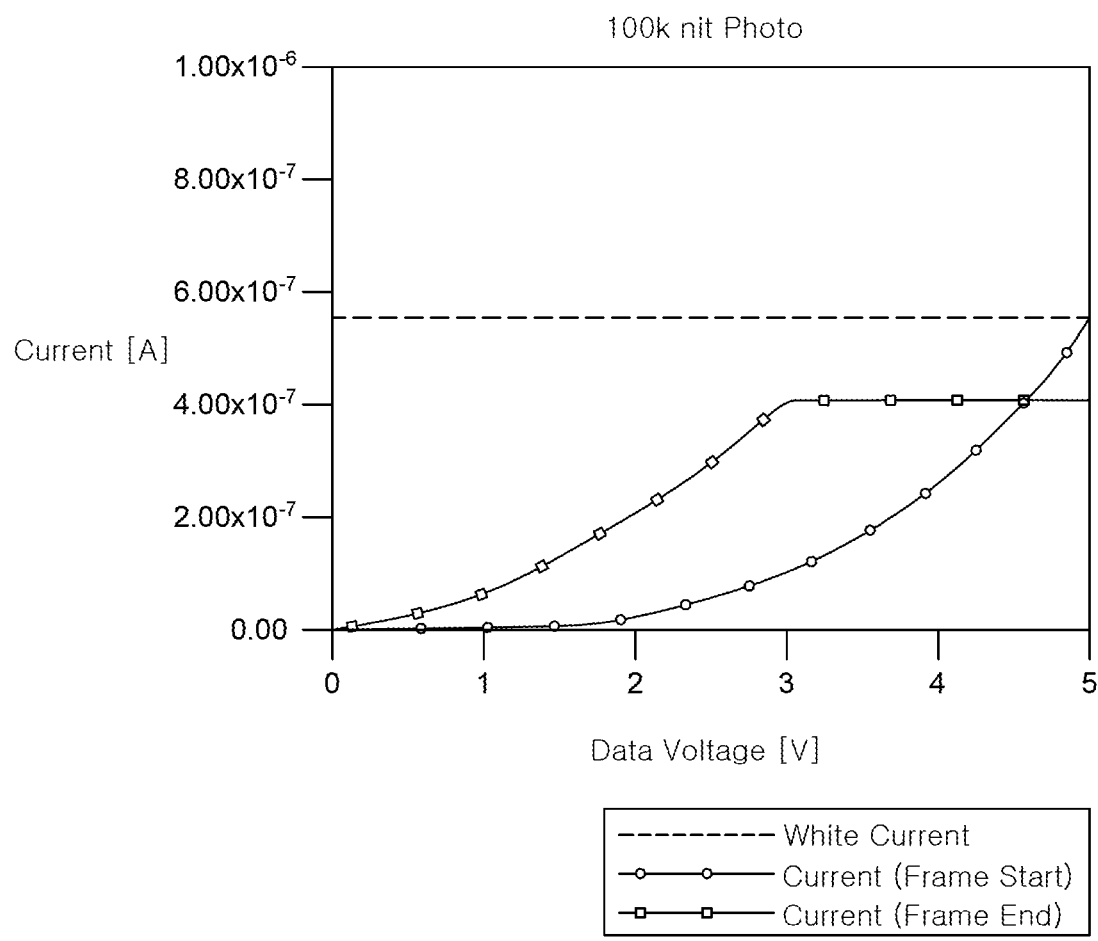
FIG. 6E is a graph illustrating a gamma curve when a shielding electrode is not applied to a plurality of TFTs and external light of 100,000 nits is irradiated.
Figure 6F:
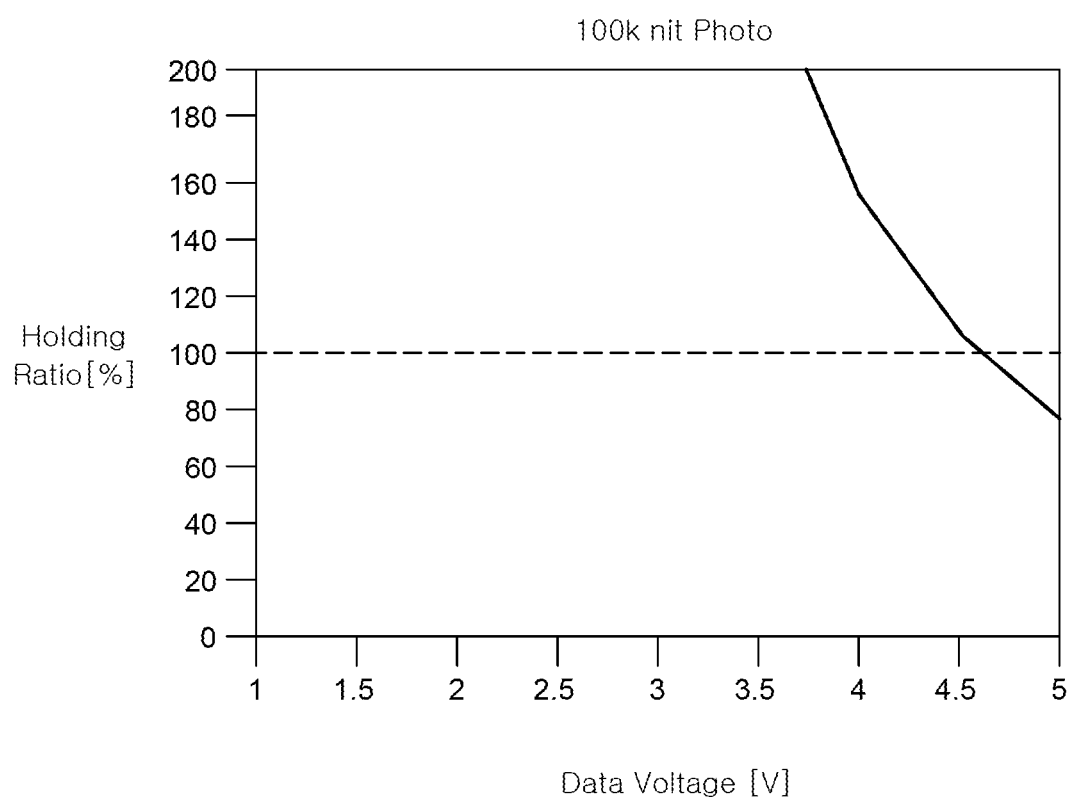
FIG. 6F is a graph illustrating a holding ratio when a shielding electrode is not applied to a plurality of TFTs and external light of 100,000 nits is irradiated.

FIG. 6A is a graph illustrating a gamma curve when a shielding electrode is not applied to a plurality of TFTs and external light is not irradiated. FIG. 6B is a graph illustrating a holding ratio when a shielding electrode is not applied to a plurality of TFTs and external light is not irradiated. FIG. 6C is a graph illustrating a gamma curve when a shielding electrode is not applied to a plurality of TFTs and external light of 20,000 nits is irradiated. FIG. 6D is a graph illustrating a holding ratio when a shielding electrode is not applied to a plurality of TFTs and external light of 20,000 nits is irradiated. FIG. 6E is a graph illustrating a gamma curve when a shielding electrode is not applied to a plurality of TFTs and external light of 100,000 nits is irradiated. FIG. 6F is a graph illustrating a holding ratio when a shielding electrode is not applied to a plurality of TFTs and external light of 100,000 nits is irradiated.

That is, FIGS. 6A to 6F are graphs obtained by measuring a gamma curve and a holding ratio while changing an intensity of external light in an organic light emitting display device of the related art in which a shielding electrode is not applied to the plurality of TFTs.

First, referring to FIG. 6A, when external light is not irradiated, if a data voltage of 0 V is applied at a frame start timing, a driving current is $1.00 \times 10^{-12}$ A or lower so that a black gray-level may be expressed. Further, when the data voltage of 5 V is applied, a driving current is $6.00 \times 10^{-7}$ A or higher, so that a white gray-level may be expressed. That is, when external light is not irradiated, all gray-levels may be expressed at the frame start timing.

Further, referring to FIG. 6A, when external light is not irradiated, if a data voltage of 0 V is applied at a frame end timing, a driving current is $1.00 \times 10^{-12}$ A or lower so that a black gray-level may be expressed. Further, when the data voltage of 5 V is applied, a driving current is $6.00 \times 10^{-7}$ A or higher, so that a white gray-level may be expressed. That is, when external light is not irradiated, all gray-levels may be expressed at the frame end timing.

Further, referring to FIG. 6B, when external light is not irradiated, a holding ratio which is a ratio of a driving current at the frame start timing and a driving current of the frame end timing is maintained at almost 100%. Therefore, when the external light is not irradiated, a gray-level expressed during one frame may be stably maintained.

Next, referring to FIG. 6C, when external light of 20,000 nits is irradiated, if a data voltage of 0 V is applied at the frame start timing, a driving current is $1.00 \times 10^{-12}$ A or lower so that a black gray-level may be expressed. Further, when the data voltage of 5 V is applied, a driving current is $6.00 \times 10^{-7}$ A or lower, so that a white gray-level may not be expressed. That is, when external light of 20,000 nits is irradiated, a sufficient white gray-level may not be expressed at the frame start timing.

Further, referring to FIG. 6C, when external light of 20,000 nits is irradiated, if a data voltage of 0 V is applied at the frame end timing, a driving current is $1.00 \times 10^{-12}$ A or lower so that a black gray-level may be expressed. Further, when the data voltage of 5 V is applied, a driving current is $6.00 \times 10^{-7}$ A or lower, so that a white gray-level may not be expressed. That is, when external light of 20,000 nits is irradiated, a sufficient white gray-level may not be expressed at the frame end timing.

Further, referring to FIG. 6D, when external light of 20,000 nits is irradiated, a holding ratio which is a ratio of a driving current at the frame start timing and a driving current of the frame end timing is changed from almost 180% to 80%. Therefore, when external light of 20,000 nits is irradiated, there is a problem in that a gray-level expressed for one frame is consistently changed.

Finally, first, referring to FIG. 6E, when external light of 100,000 nits is irradiated, if a data voltage of 0 V is applied at the frame start timing, a driving current is $1.00 \times 10^{-12}$)A or lower so that a black gray-level may be expressed. Further, when the data voltage of 5 V is applied, a driving current is $6.00 \times 10^{-7}$)A or lower, so that a white gray-level may not be expressed. That is, when external light of 100,000 nits is irradiated, a sufficient white gray-level may not be expressed at the frame start timing.

Further, referring to FIG. 6E, when external light of 100,000 nits is irradiated, if a data voltage of 0 V is applied at the frame end timing, a driving current is $1.00 \times 10^{-12}$ A or lower so that a black gray-level may be expressed. Further, when the data voltage of 3 V is applied, a driving current is maintained at $4.00 \times 10^{-7}$ A, That is, a driving current is $6.00 \times 10^{-7}$ A or lower when the data voltage of 3 V is applied, so that a white gray-level may not be expressed. That is, when external light of 100,000 nits is irradiated, a sufficient white gray-level may not be expressed at the frame end timing.

Further, referring to FIG. 6F, when external light of 100,000 nits is irradiated, a holding ratio which is a ratio of a driving current at the frame start timing and a driving current of the frame end timing is continuously changed. Therefore, even though external light of 100,000 nits is irradiated, there is a problem in that a gray-level expressed for one frame is consistently changed.

That is, as seen from FIGS. 6A to 6F, when an intensity of external light which is irradiated onto the organic light emitting display device of the related art in which a shielding electrode is not applied to the plurality of TFTs is increased, the organic light emitting display device may not express a sufficient white gray-level. Further, there is a problem in that a gray-level expressed for one frame is consistently changed.

Figure 7A:
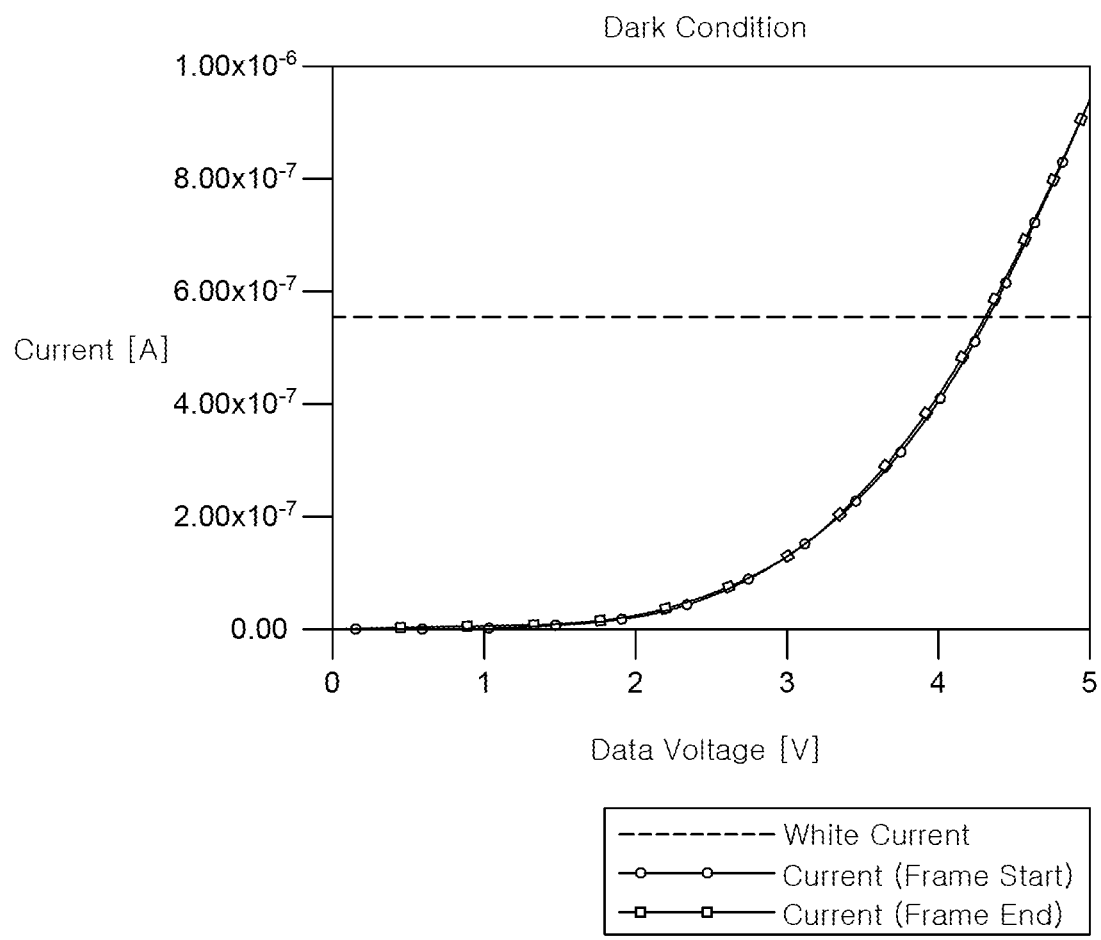
FIG. 7A is a graph illustrating a gamma curve when a shielding electrode is applied to all of a plurality of TFTs and external light is not irradiated.
Figure 7B:
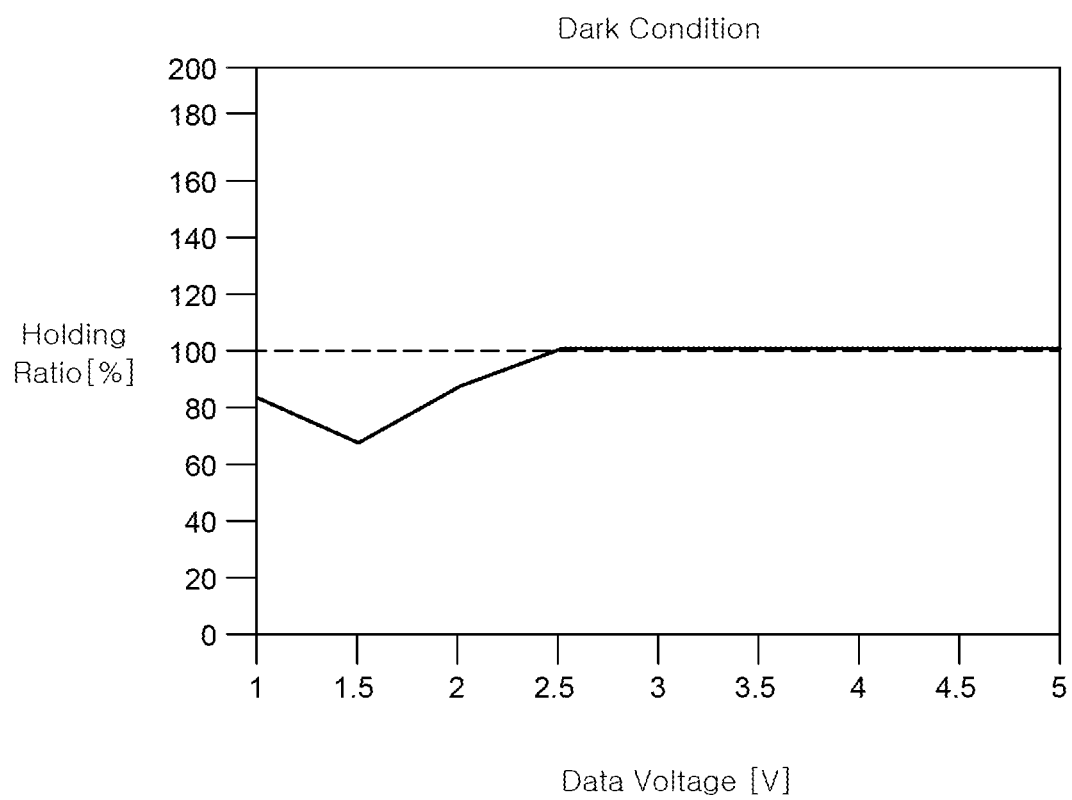
FIG. 7B is a graph illustrating a holding ratio when a shielding electrode is applied to all of a plurality of TFTs and external light is not irradiated.
Figure 7C:
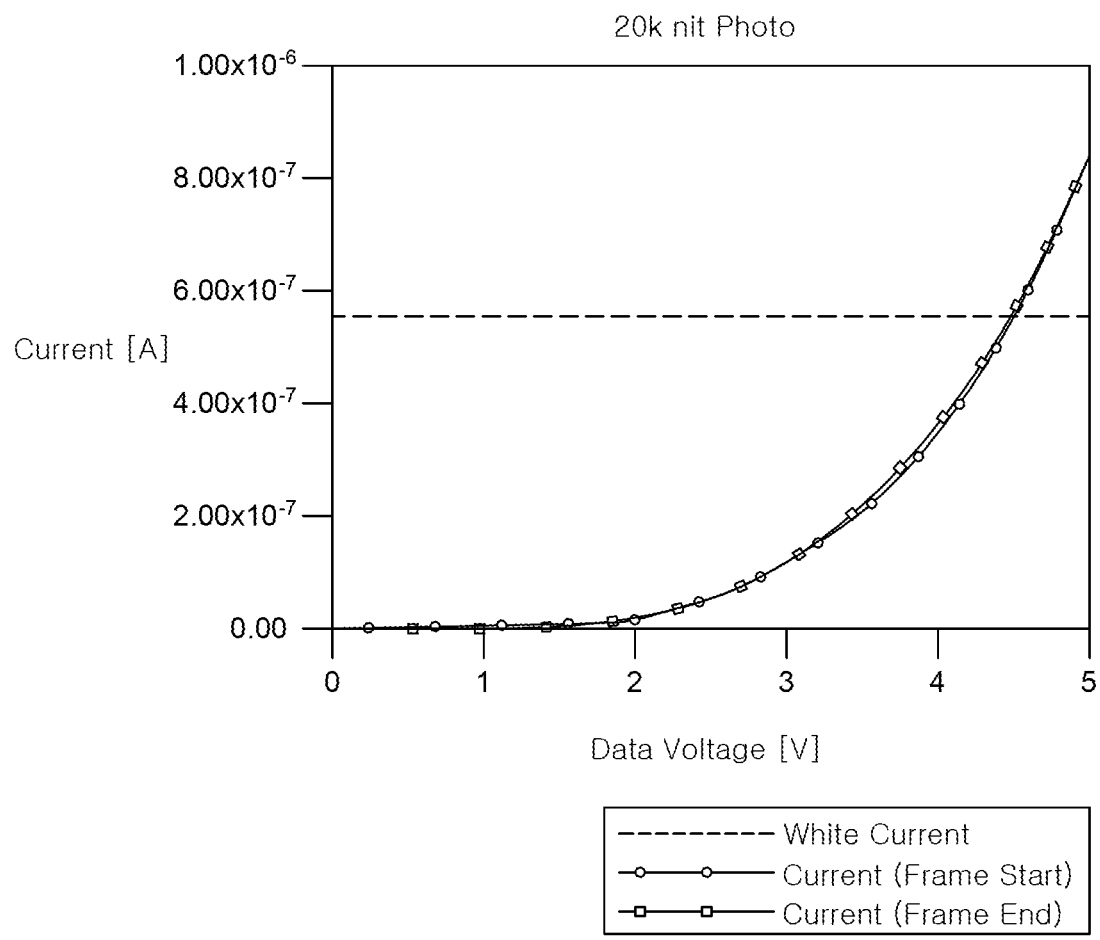
FIG. 7C is a graph illustrating a gamma curve when a shielding electrode is applied to all of a plurality of TFTs and external light of 20,000 nits is irradiated.
Figure 7D:
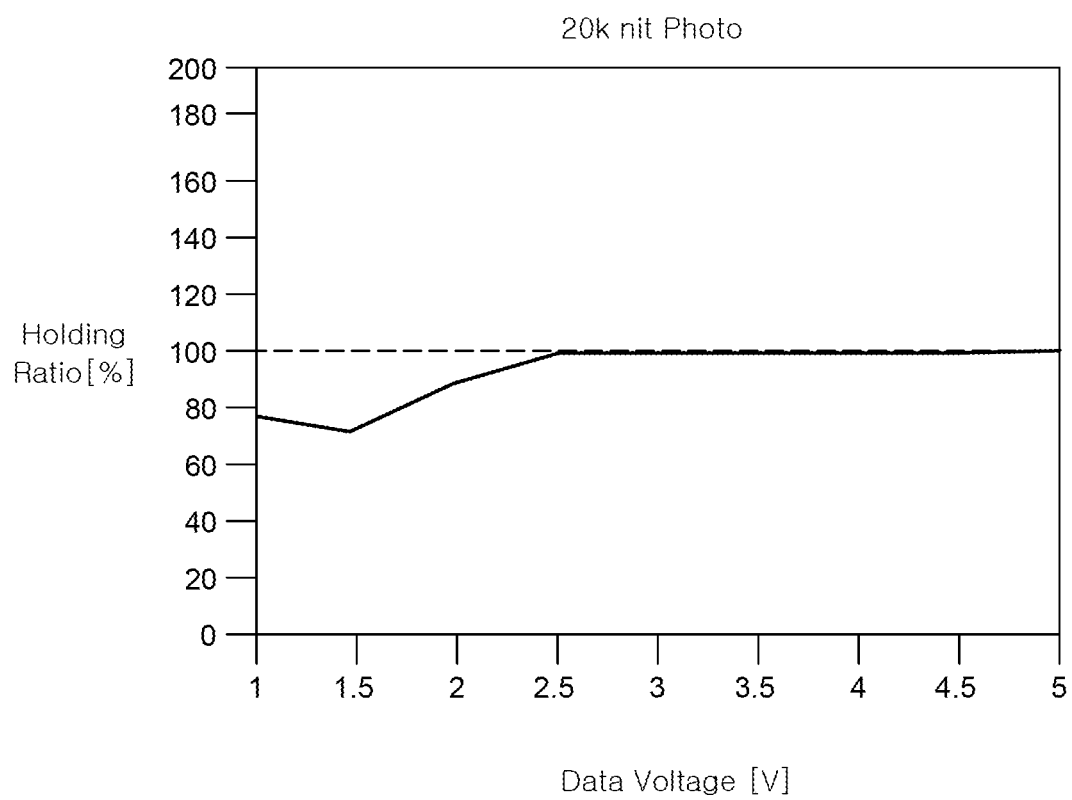
FIG. 7D is a graph illustrating a holding ratio when a shielding electrode is applied to all of a plurality of TFTs and external light of 20,000 nits is irradiated.
Figure 7E:
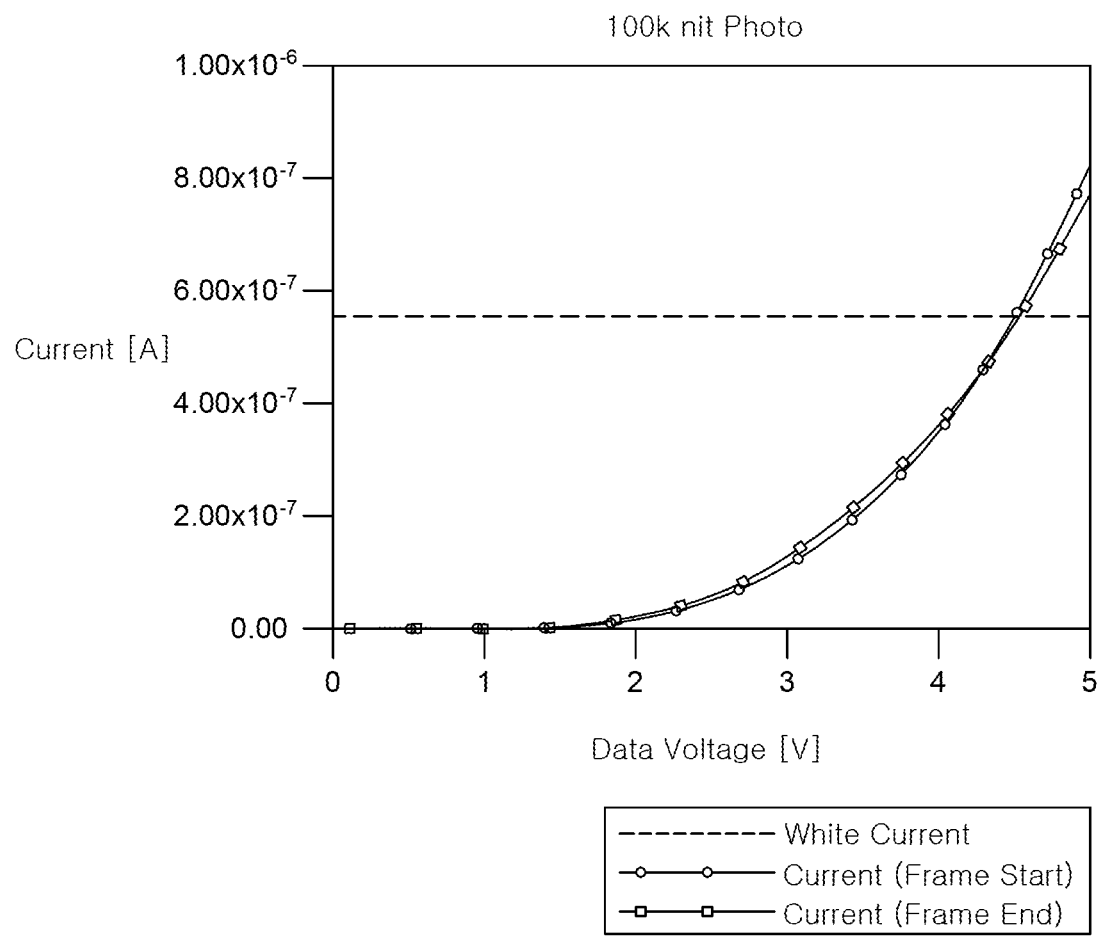
FIG. 7E is a graph illustrating a gamma curve when a shielding electrode is applied to all of a plurality of TFTs and external light of 100,000 nits is irradiated.
Figure 7F:
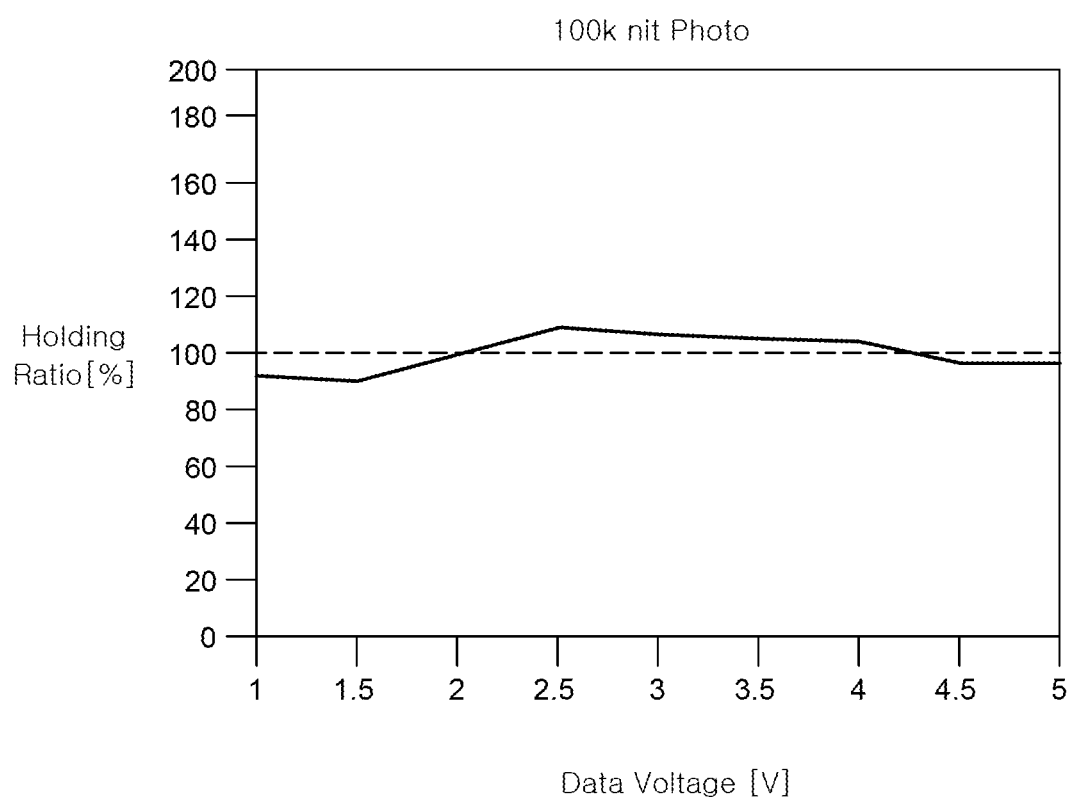
FIG. 7F is a graph illustrating a holding ratio when a shielding electrode is applied to all of a plurality of TFTs and external light of 100,000 nits is irradiated.

FIG. 7A is a graph illustrating a gamma curve when a shielding electrode is applied to all of a plurality of TFTs and external light is not irradiated. FIG. 7B is a graph illustrating a holding ratio when a shielding electrode is applied to all of a plurality of TFTs and external light is not irradiated. FIG. 7C is a graph illustrating a gamma curve when a shielding electrode is applied to all of a plurality of TFTs and external light of 20,000 nits is irradiated. FIG. 7D is a graph illustrating a holding ratio when a shielding electrode is applied to all of a plurality of TFTs and external light of 20,000 nits is irradiated. FIG. 7E is a graph illustrating a gamma curve when a shielding electrode is applied to all of a plurality of TFTs and external light of 100,000 nits is irradiated. FIG. 7F is a graph illustrating a holding ratio when a shielding electrode is applied to all of a plurality of TFTs and external light of 100,000 nits is irradiated.

That is, FIGS. 7A to 7F are graphs obtained by measuring a gamma curve and a holding ratio while changing an intensity of external light in an organic light emitting display device in which a shielding electrode is applied to all the plurality of TFTs.

First, referring to FIGS. 7A, 7C, and 7E, when external light is not irradiated or even though external light of 20,000 nits or 100,000 nits is irradiated, if a data voltage of 0 V is applied at a frame start timing, a driving current is $1.00 \times 10^{-12}$ A or lower. Therefore, a black gray-level may be expressed. Further, when the data voltage of 5 V is applied, a driving current is $6.00 \times 10^{-7}$ A or higher, so that a white gray-level may be expressed. That is, when external light is not irradiated or even though external light of 20,000 nits or 100,000 nits is irradiated, all gray-levels may be expressed at the frame start timing.

Further, referring to FIGS. 7A, 7C, and 7E, when external light is not irradiated or even though external light of 20,000 nits or 100,000 nits is irradiated, if a data voltage of 0 V is applied at a frame end timing, a driving current is $1.00 \times 10^{-12}$ A or lower. Therefore, a black gray-level may be expressed. Further, when the data voltage of 5 V is applied, a driving current is $6.00 \times 10^{-7}$ A or higher, so that a white gray-level may be expressed. That is, when external light is not irradiated or even though external light of 20,000 nits or 100,000 nits is irradiated, all gray-levels may be expressed at the frame end timing.

Referring to FIGS. 7B, 7D, and 7F, when external light is not irradiated or even though external light of 20,000 nits or 100,000 nits is irradiated, a holding ratio which is a ratio of a driving current of the frame start timing and a driving current of the frame end timing is maintained at almost 100%. Therefore, when external light is not irradiated or even though external light of 20,000 nits or 100,000 nits is irradiated, a gray-level which is expressed for one frame may be stably maintained.

That is, FIGS. 6A to 6F which illustrate a driving characteristic of the organic light emitting display device of the related art in which the shielding electrode is not applied to the plurality of TFTs and FIGS. 7A to 7F which illustrate a driving characteristic of an organic light emitting display device in which the shielding electrode is applied to all the plurality of TFTs are compared as follows.

When the shielding electrode is applied to all the plurality of TFTs, even though external light of 20,000 nits or 100,000 nits is irradiated, external light having a high brightness may not be directly incident onto the active layer ACT configured by LTPS of the plurality of TFTs due to the shielding electrode. Therefore, the light leakage current of the plurality of TFTs may be blocked. As a result, it is understood that the organic light emitting display device not only expresses all gray-levels from a black gray-level to a white gray-level, but also stably maintains a gray-level expressed for one frame.

Figure 8A:
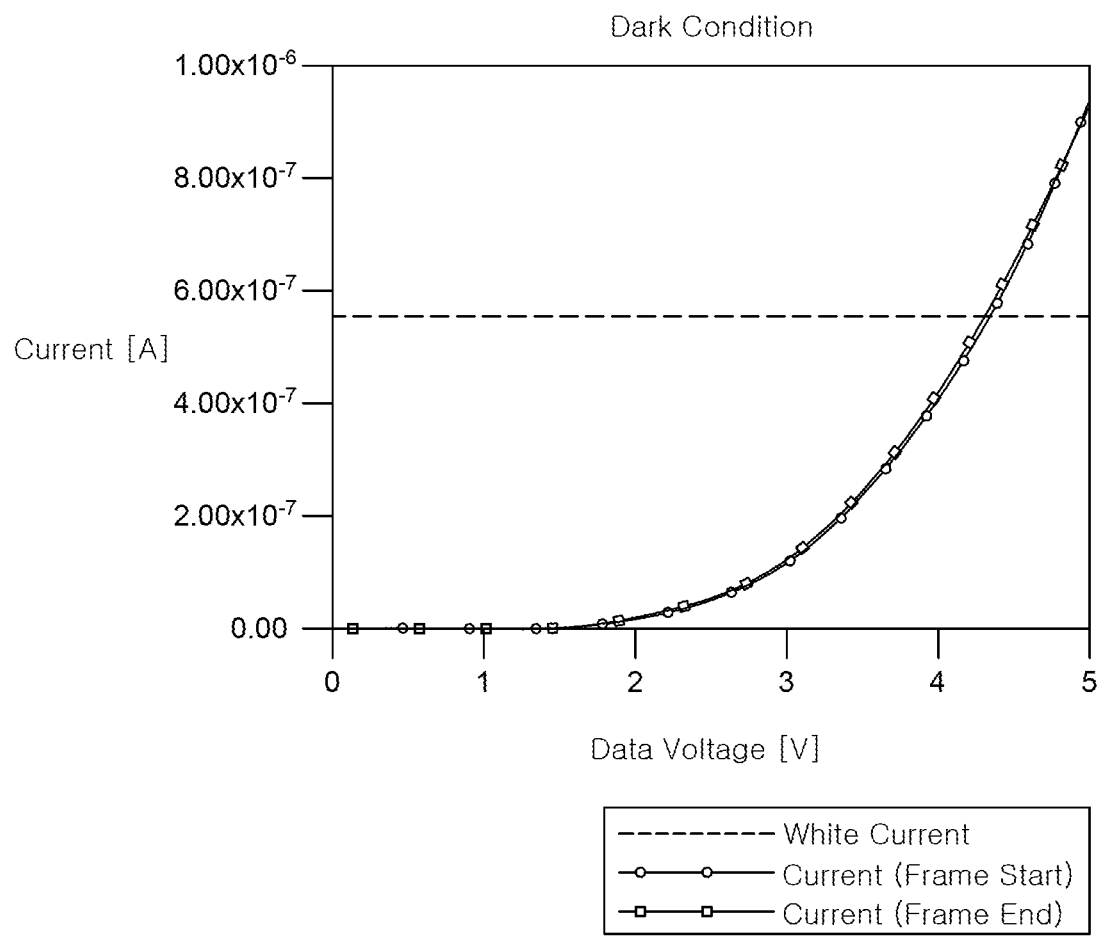
FIG. 8A is a graph illustrating a gamma curve when a shielding electrode is applied only to a driving TFT, a sampling TFT, and a first initializing TFT and external light is not irradiated.
Figure 8B:
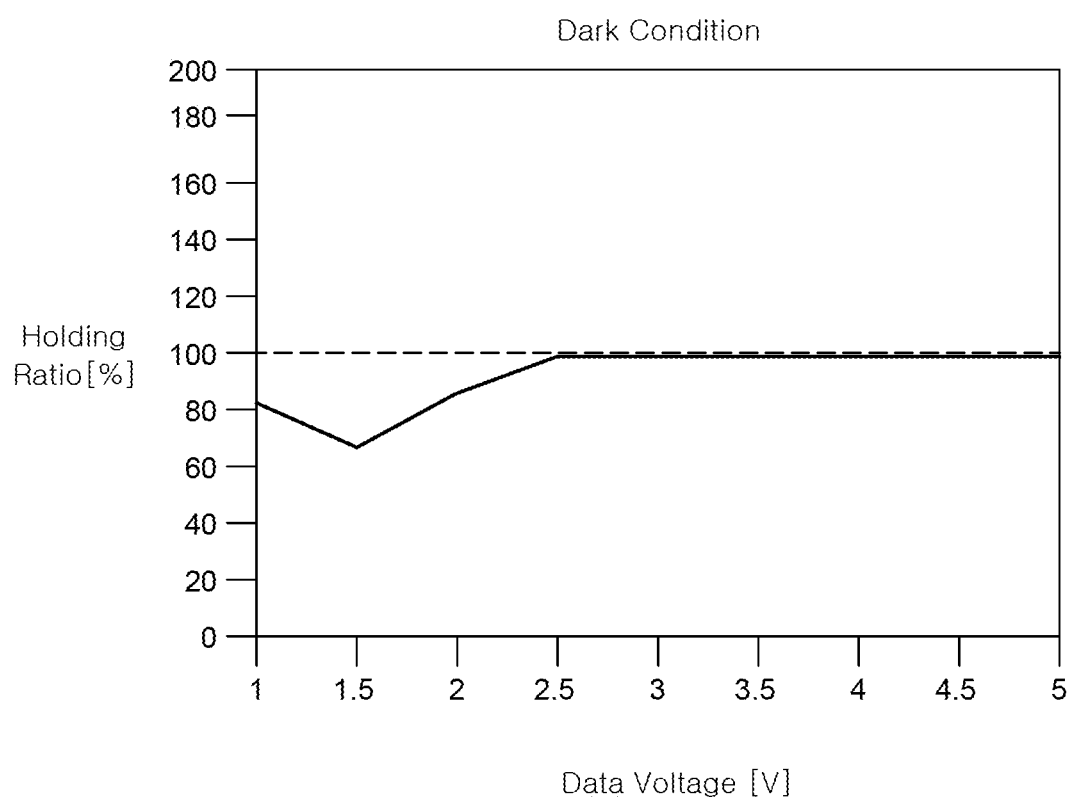
FIG. 8B is a graph illustrating a holding ratio when a shielding electrode is applied only to a driving TFT, a sampling TFT, and a first initializing TFT and external light is not irradiated.
Figure 8C:
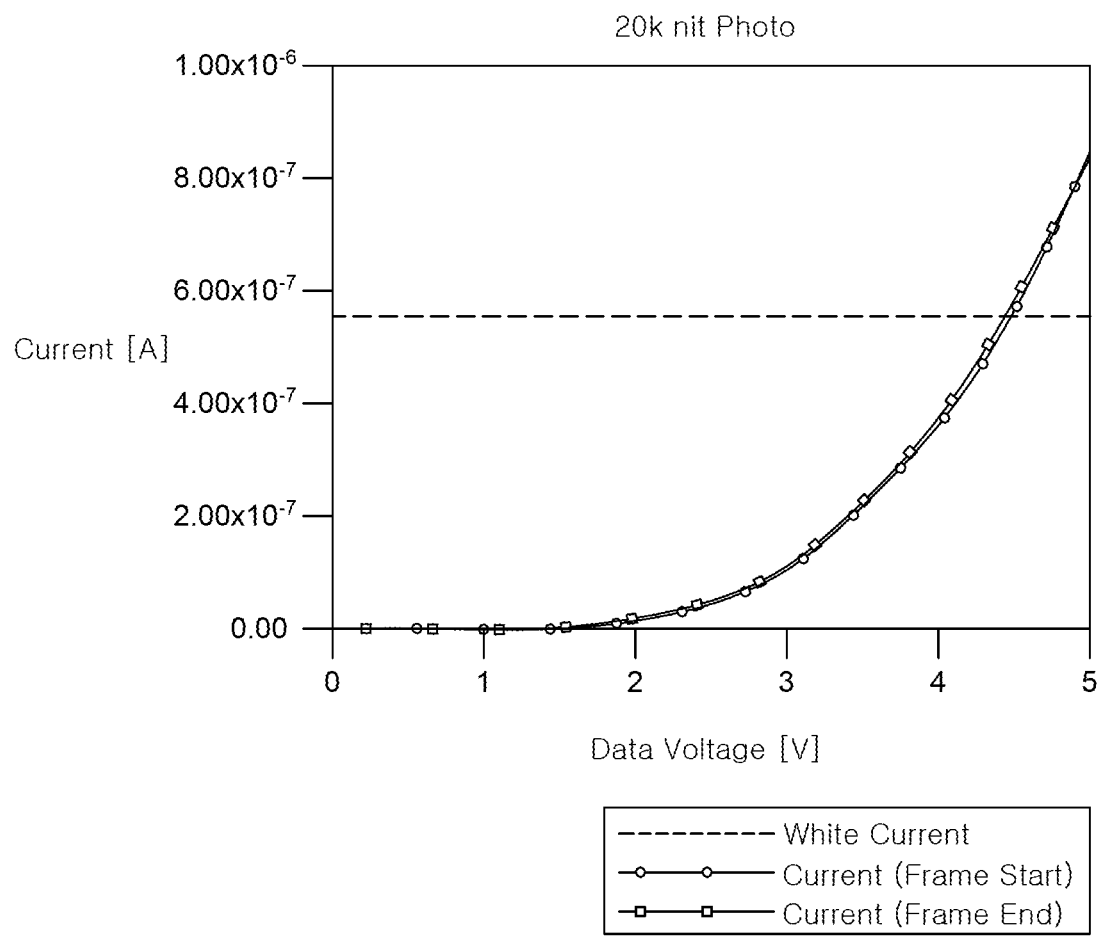
FIG. 8C is a graph illustrating a gamma curve when a shielding electrode is applied only to a driving TFT, a sampling TFT, and a first initializing TFT and external light of 20,000 nits is irradiated.
Figure 8D:
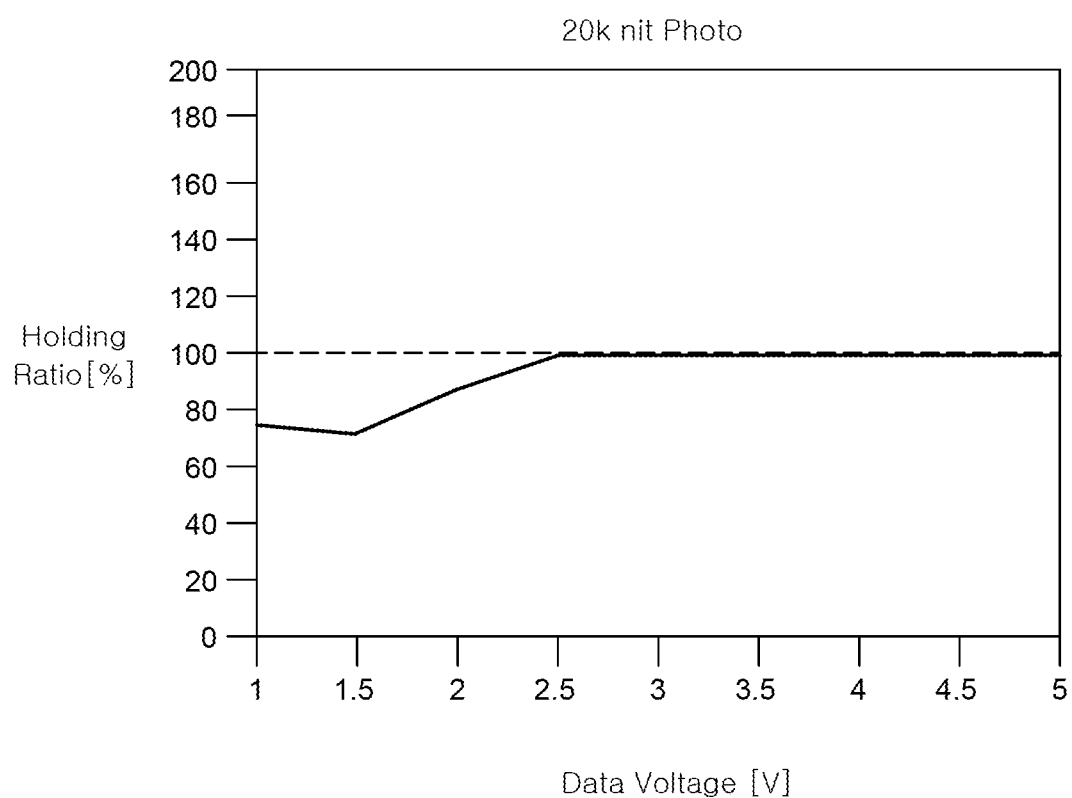
FIG. 8D is a graph illustrating a holding ratio when a shielding electrode is applied only to a driving TFT, a sampling TFT, and a first initializing TFT and external light of 20,000 nits is irradiated.
Figure 8E:
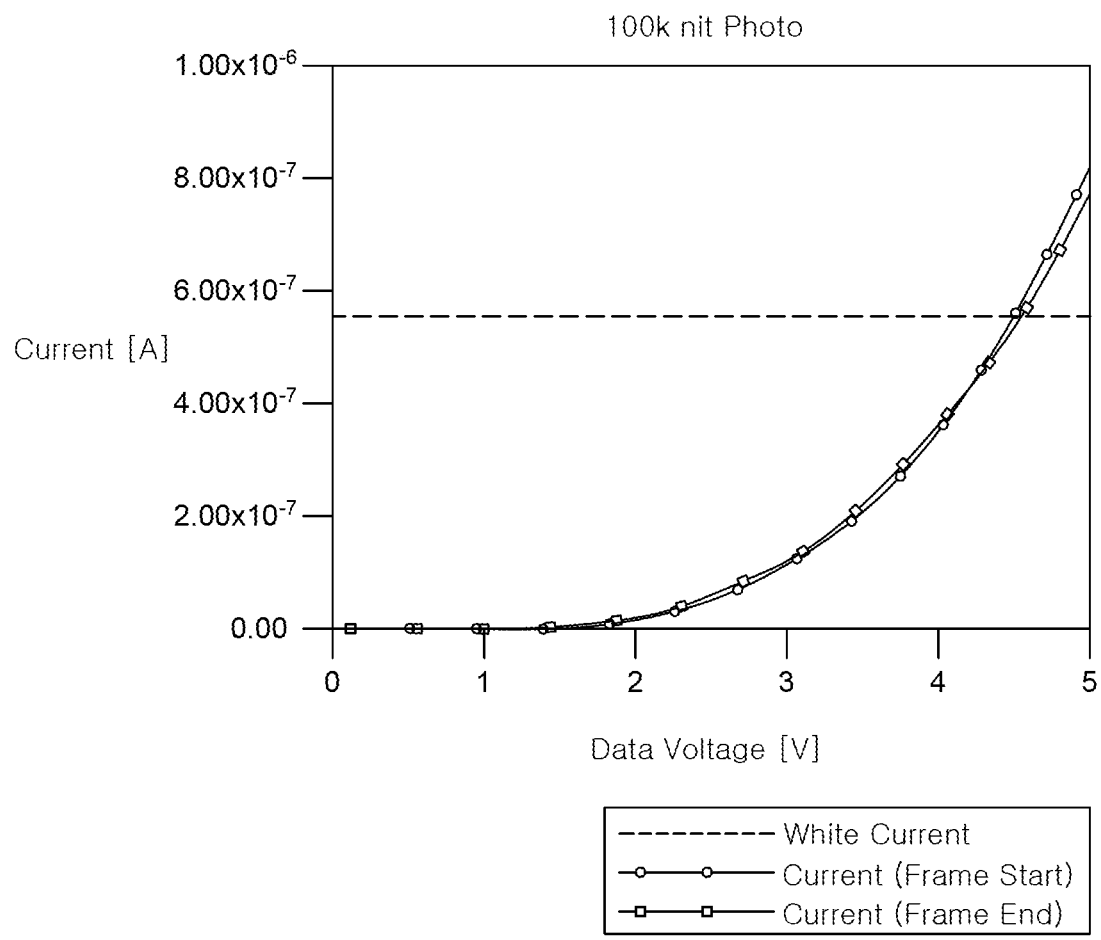
FIG. 8E is a graph illustrating a gamma curve when a shielding electrode is applied only to a driving TFT, a sampling TFT, and a first initializing TFT and external light of 100,000 nits is irradiated.
Figure 8F:
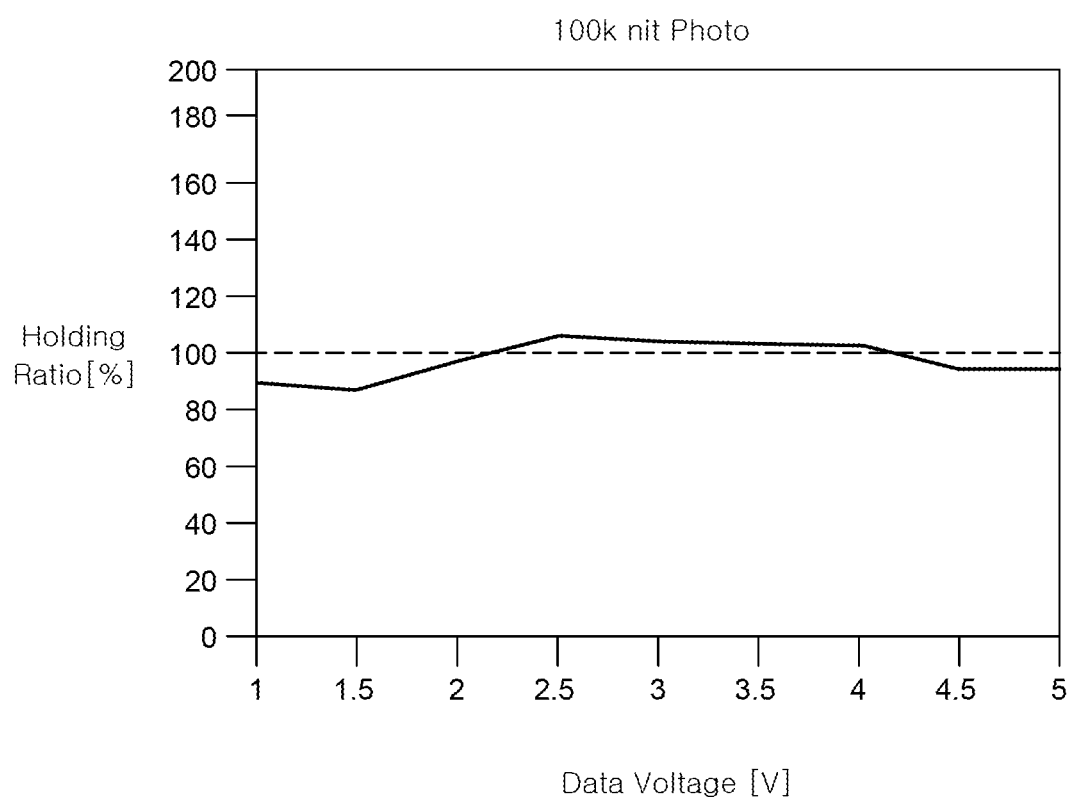
FIG. 8F is a graph illustrating a holding ratio when a shielding electrode is applied only to a driving TFT, a sampling TFT, and a first initializing TFT and external light of 100,000 nits is irradiated.

FIG. 8A is a graph illustrating a gamma curve when a shielding electrode is applied only to a driving TFT, a sampling TFT, and a first initializing TFT and external light is not irradiated. FIG. 8B is a graph illustrating a holding ratio when a shielding electrode is applied only to a driving TFT, a sampling TFT, and a first initializing TFT and external light is not irradiated. FIG. 8C is a graph illustrating a gamma curve when a shielding electrode is applied only to a driving TFT, a sampling TFT, and a first initializing TFT and external light of 20,000 nits is irradiated. FIG. 8D is a graph illustrating a holding ratio when a shielding electrode is applied only to a driving TFT, a sampling TFT, and a first initializing TFT and external light of 20,000 nits is irradiated. FIG. 8E is a graph illustrating a gamma curve when a shielding electrode is applied only to a driving TFT, a sampling TFT, and a first initializing TFT and external light of 100,000 nits is irradiated. FIG. 8F is a graph illustrating a holding ratio when a shielding electrode is applied only to a driving TFT, a sampling TFT, and a first initializing TFT and external light of 100,000 nits is irradiated.

That is, FIGS. 8A to 8F are graphs obtained by measuring a gamma curve and a holding ratio while changing an intensity of external light in an organic light emitting display device in which a shielding electrode is applied only to a driving TFT DRT, a sampling TFT SPT, and a first initializing TFT INT1.

First, referring to FIGS. 8A, 8C, and 8E, when external light is not irradiated or even though external light of 20,000 nits or 100,000 nits is irradiated, if a data voltage of 0 V is applied at a frame start timing, a driving current is $1.00 \times 10^{-12}$ A or lower. Therefore, a black gray-level may be expressed. Further, when the data voltage of 5 V is applied, a driving current is $6.00 \times 10^{-7}$ A or higher, so that a white gray-level may be expressed. That is, when external light is not irradiated or even though external light of 20,000 nits or 100,000 nits is irradiated, all gray-levels may be expressed at the frame start timing.

Further, referring to FIGS. 8A, 8C, and 8E, when external light is not irradiated or even though external light of 20,000 nits or 100,000 nits is irradiated, if a data voltage of 0 V is applied at a frame end timing, a driving current is $1.00 \times 10^{-12}$ A or lower. Therefore, a black gray-level may be expressed. Further, when the data voltage of 5 V is applied, a driving current is $6.00 \times 10^{-12}$ A or higher, so that a white gray-level may be expressed. That is, when external light is not irradiated or even though external light of 20,000 nits or 100,000 nits is irradiated, all gray-levels may be expressed at the frame end timing.

Further, referring to FIGS. 8B, 8D, and 8F, when external light is not irradiated or even though external light of 20,000 nits or 100,000 nits is irradiated, a holding ratio which is a ratio of a driving current of the frame start timing and a driving current of the frame end timing is maintained at almost 100%. Therefore, when external light is not irradiated or even though external light of 20,000 nits or 100,000 nits is irradiated, a gray-level which is expressed for one frame may be stably maintained.

That is, FIGS. 7A to 7F which illustrate a driving characteristic of an organic light emitting display device in which the shielding electrode is applied to all the plurality of TFTs and FIGS. 8A to 8F which illustrate a driving characteristic of an organic light emitting display device in which a shielding electrode is applied only to a driving TFT DRT, a sampling TFT SPT, and a first initializing TFT INT1 are compared as follows.

As described above, FIGS. 7A to 7F are illustrated as same as FIGS. 8A to 8F, respectively. That is, even though the shielding electrode is applied only to the driving TFT DRT, the sampling TFT SPT, and the first initializing TFT INT1 rather than all the plurality of TFTs, it is understood that the organic light emitting display device 100 not only expresses all gray-levels from a black gray-level to a white gray-level, but also stably maintains a gray-level expressed for one frame.

Figure 9A:
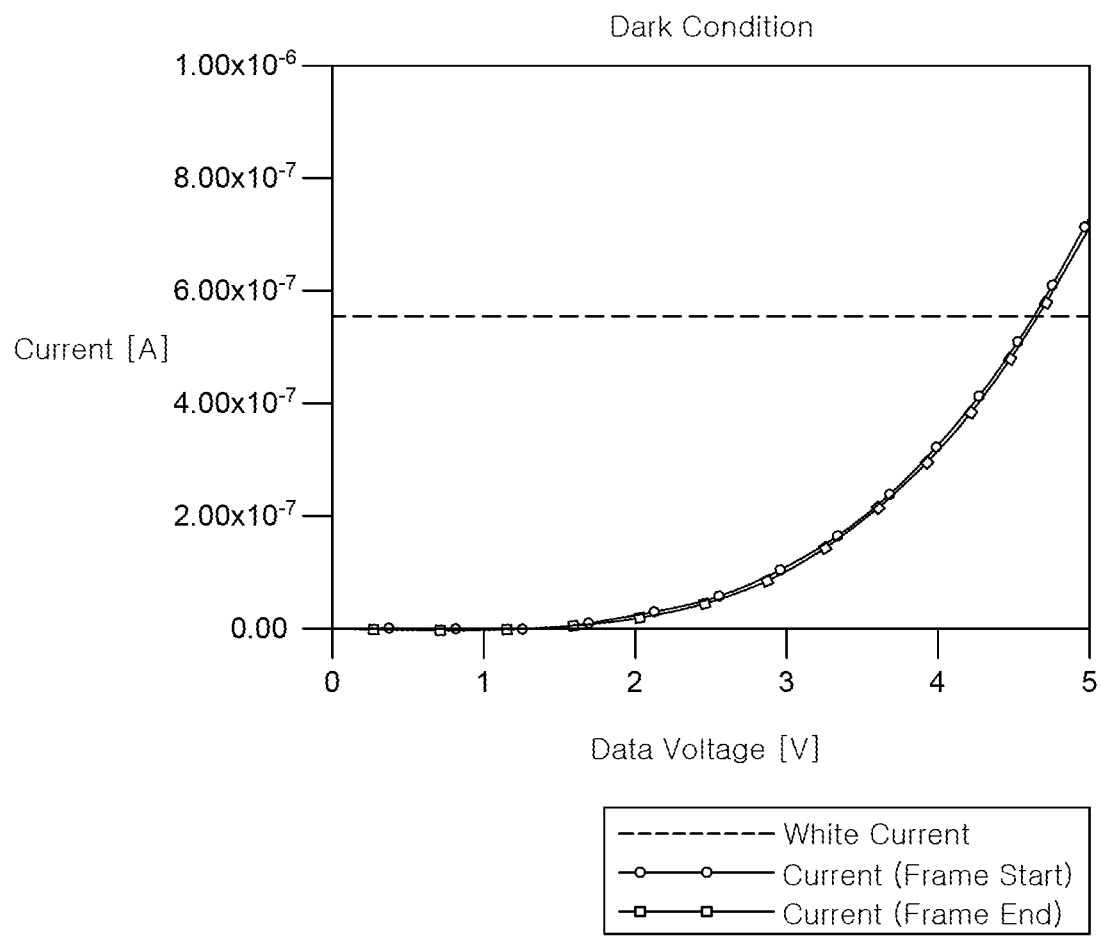
FIG. 9A is a graph illustrating a gamma curve when a shielding electrode is applied only to a sampling TFT and a first initializing TFT and external light is not irradiated.
Figure 9B:
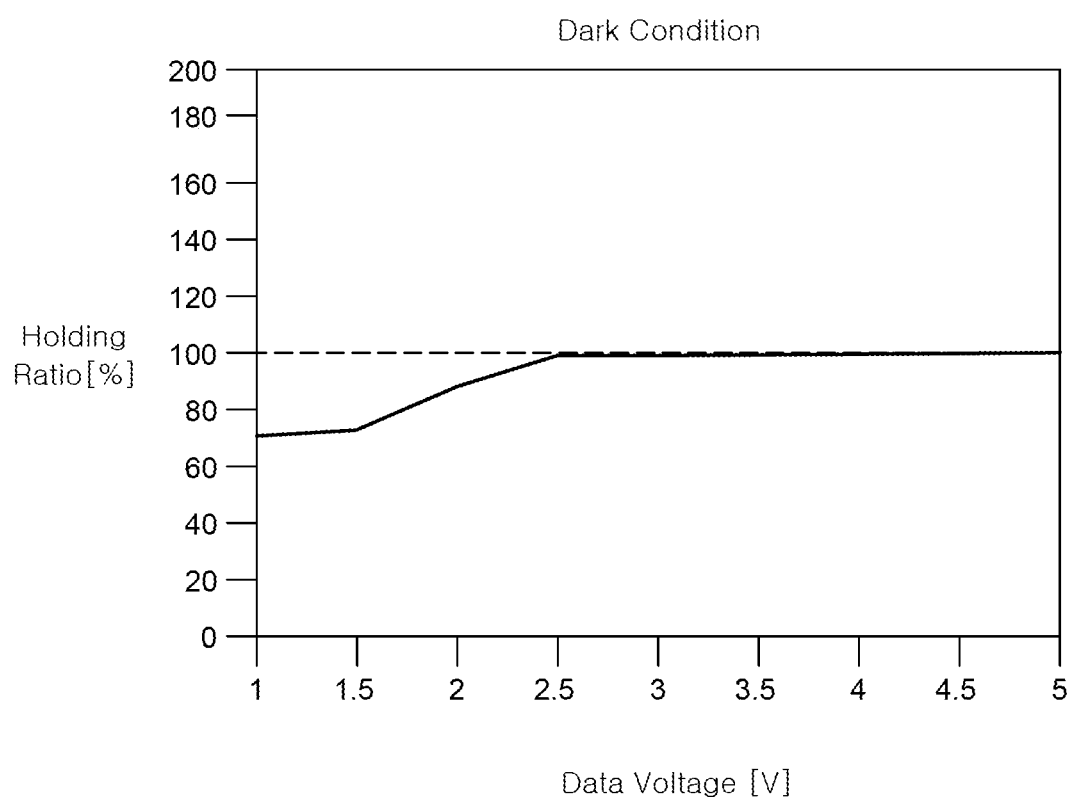
FIG. 9B is a graph illustrating a holding ratio when a shielding electrode is applied only to a sampling TFT and a first initializing TFT and external light is not irradiated.
Figure 9C:
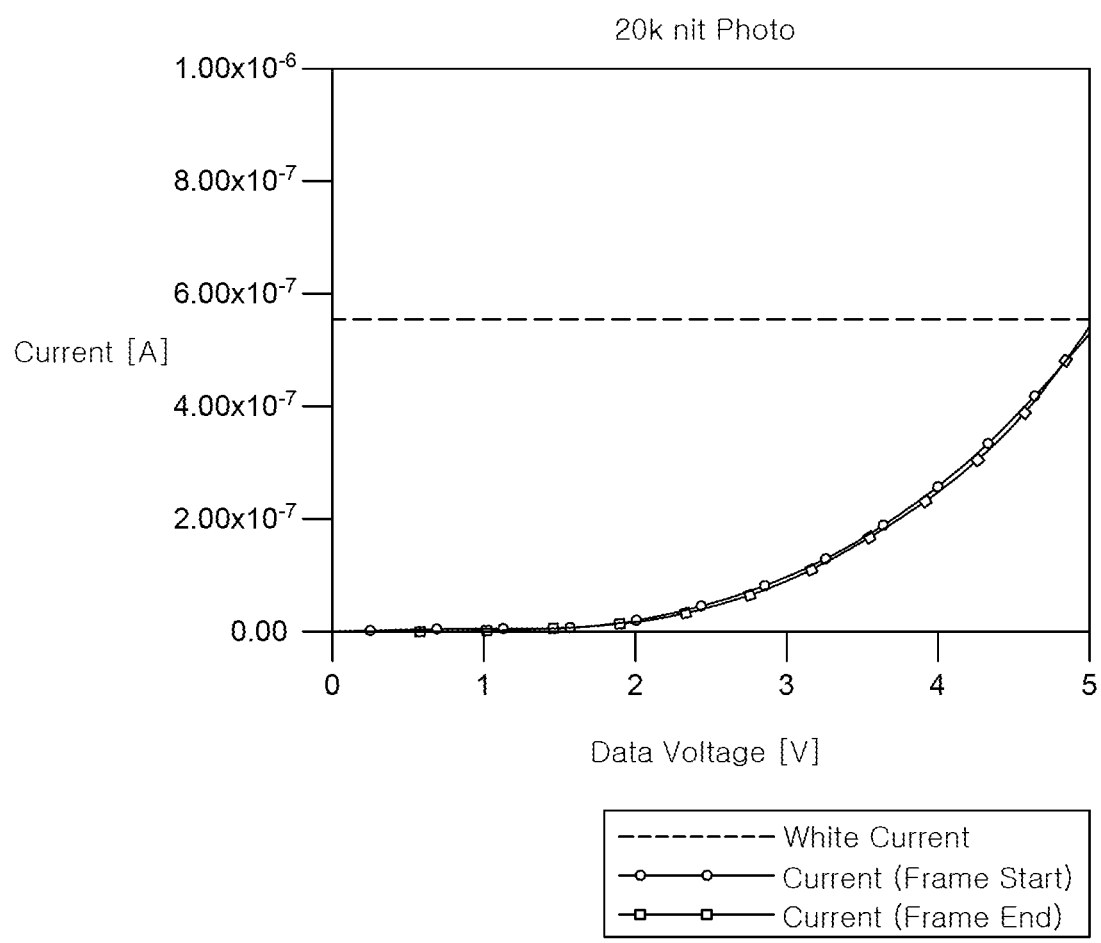
FIG. 9C is a graph illustrating a gamma curve when a shielding electrode is applied only to a sampling TFT and a first initializing TFT and external light of 20,000 nits is irradiated.
Figure 9D:
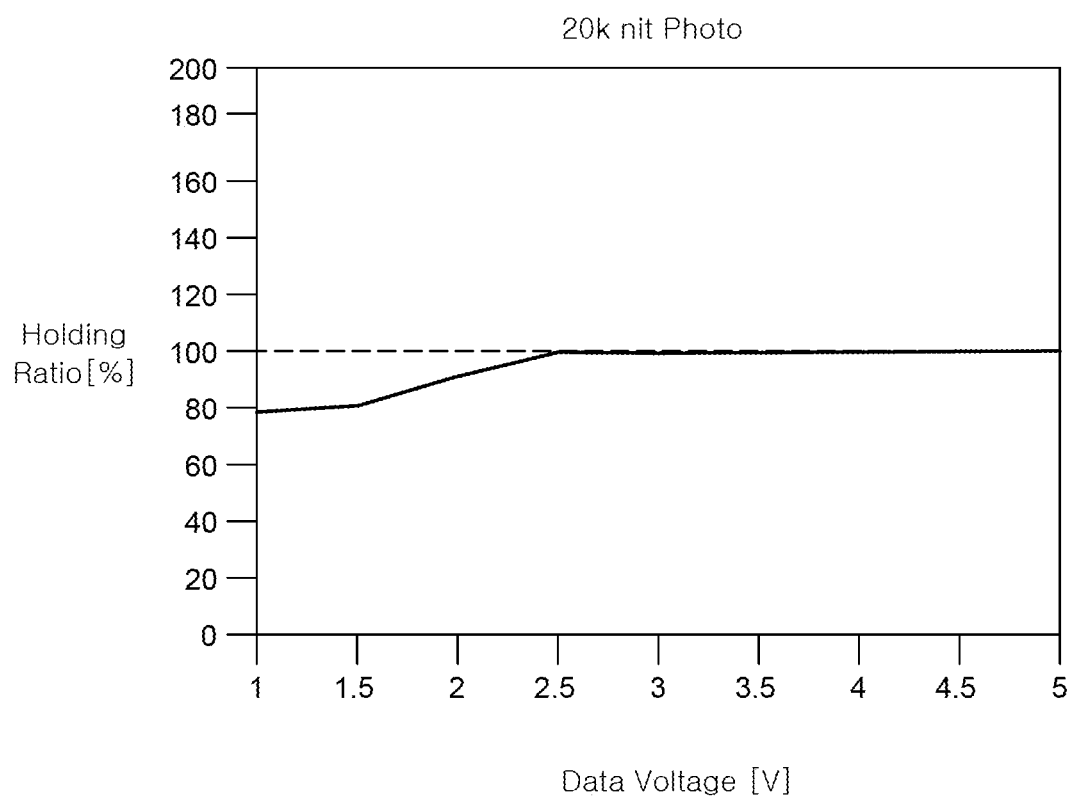
FIG. 9D is a graph illustrating a holding ratio when a shielding electrode is applied only to a sampling TFT and a first initializing TFT and external light of 20,000 nits is irradiated.
Figure 9E:
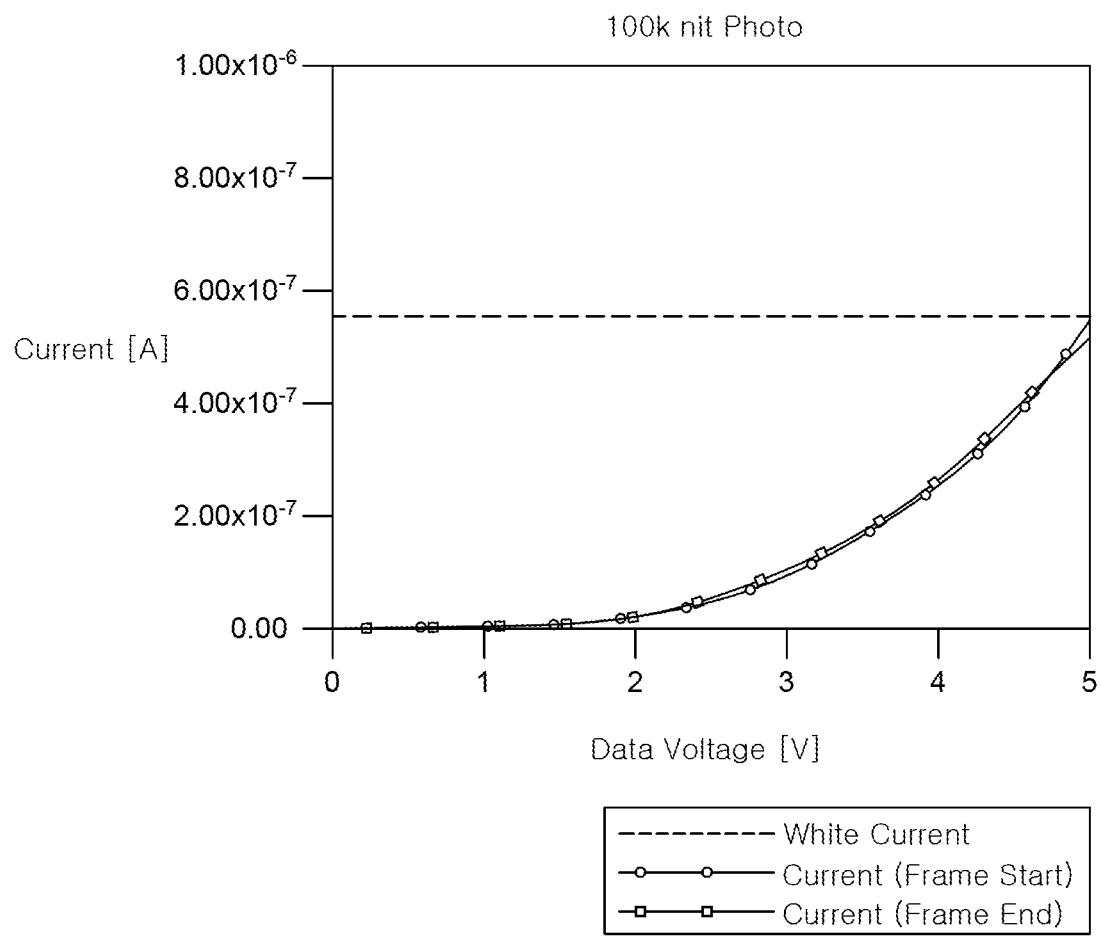
FIG. 9E is a graph illustrating a gamma curve when a shielding electrode is applied only to a sampling TFT and a first initializing TFT and external light of 100,000 nits is irradiated.
Figure 9F:
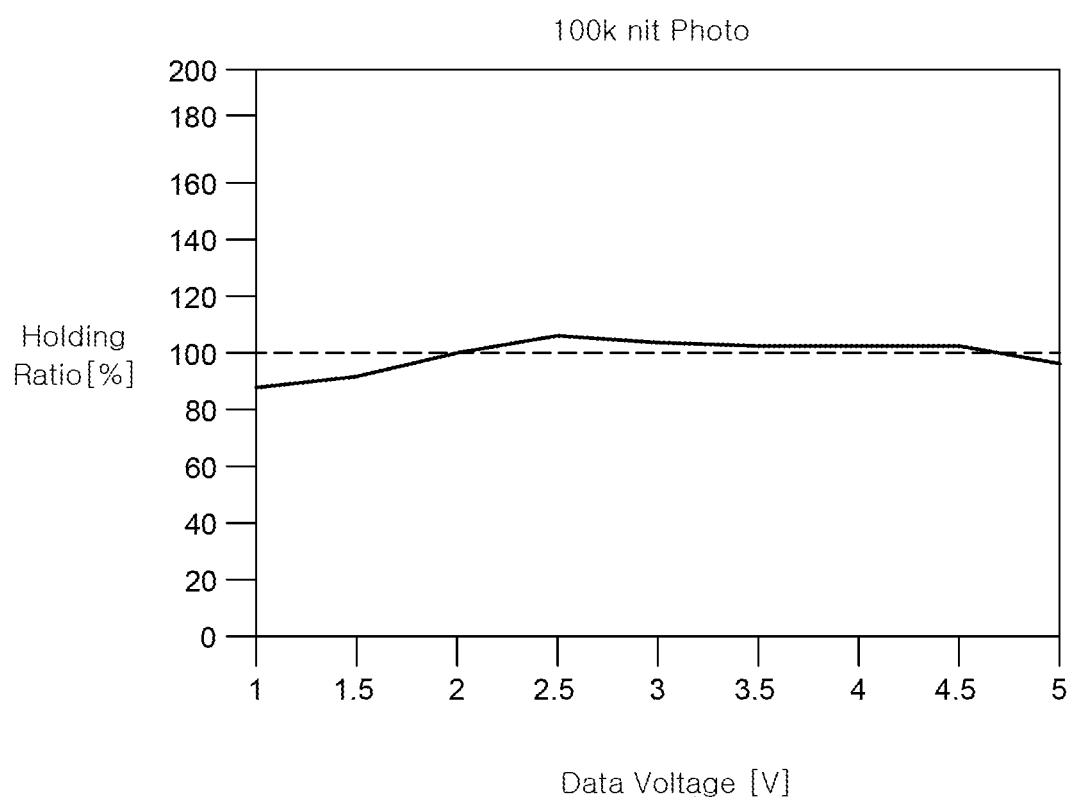
FIG. 9F is a graph illustrating a holding ratio when a shielding electrode is applied only to a sampling TFT and a first initializing TFT and external light of 100,000 nits is irradiated.

FIG. 9A is a graph illustrating a gamma curve when a shielding electrode is applied only to a sampling TFT and a first initializing TFT and external light is not irradiated. FIG. 9B is a graph illustrating a holding ratio when a shielding electrode is applied only to a sampling TFT and a first initializing TFT and external light is not irradiated. FIG. 9C is a graph illustrating a gamma curve when a shielding electrode is applied only to a sampling TFT and a first initializing TFT and external light of 20,000 nits is irradiated. FIG. 9D is a graph illustrating a holding ratio when a shielding electrode is applied only to a sampling TFT and a first initializing TFT and external light of 20,000 nits is irradiated. FIG. 9E is a graph illustrating a gamma curve when a shielding electrode is applied only to a sampling TFT and a first initializing TFT and external light of 100,000 nits is irradiated. FIG. 9F is a graph illustrating a holding ratio when a shielding electrode is applied only to a sampling TFT and a first initializing TFT and external light of 100,000 nits is irradiated.

That is, FIGS. 9A to 9F are graphs obtained by measuring a gamma curve and a holding ratio while changing an intensity of external light in an organic light emitting display device in which a shielding electrode is applied only to a sampling TFT SPT and a first initializing TFT INT1.

First, referring to FIG. 9A, when external light is not irradiated, if a data voltage of 0 V is applied at a frame start timing, a driving current is $1.00 \times 10^{-12}$ A or lower so that a black gray-level may be expressed. Further, when the data voltage of 5 V is applied, a driving current is $6.00 \times 10^{-7}$ A or higher, so that a white gray-level may be expressed. That is, when external light is not irradiated, all gray-levels may be expressed at the frame start timing.

Further, referring to FIG. 9A, when external light is not irradiated, if a data voltage of 0 V is applied at a frame end timing, a driving current is $1.00 \times 10^{-12}$ A or lower so that a black gray-level may be expressed. Further, when the data voltage of 5 V is applied, a driving current is $6.00 \times 10^{-7}$ A or higher, so that a white gray-level may be expressed. That is, when external light is not irradiated, all gray-levels may be expressed at the frame end timing.

In contrast, referring to FIGS. 9C and 9E, when external light of 20,000 nits or 100,000 nits is irradiated, if a data voltage of 5 V is applied, a driving current is $6.00 \times 10^{-7}$ A or lower so that a white gray-level may not be expressed. That is, when external light of 20,000 nits or 100,000 nits is irradiated, a sufficient white gray-level may not be expressed at the frame start timing.

Further, referring to FIGS. 9B, 9D, and 9F, when external light is not irradiated or even though external light of 20,000 nits or 100,000 nits is irradiated, a holding ratio which is a ratio of a driving current of the frame start timing and a driving current of the frame end timing is maintained at almost 100%. Therefore, when external light is not irradiated or even though external light of 20,000 nits or 100,000 nits is irradiated, a gray-level which is expressed for one frame may be stably maintained.

Figure 10A:
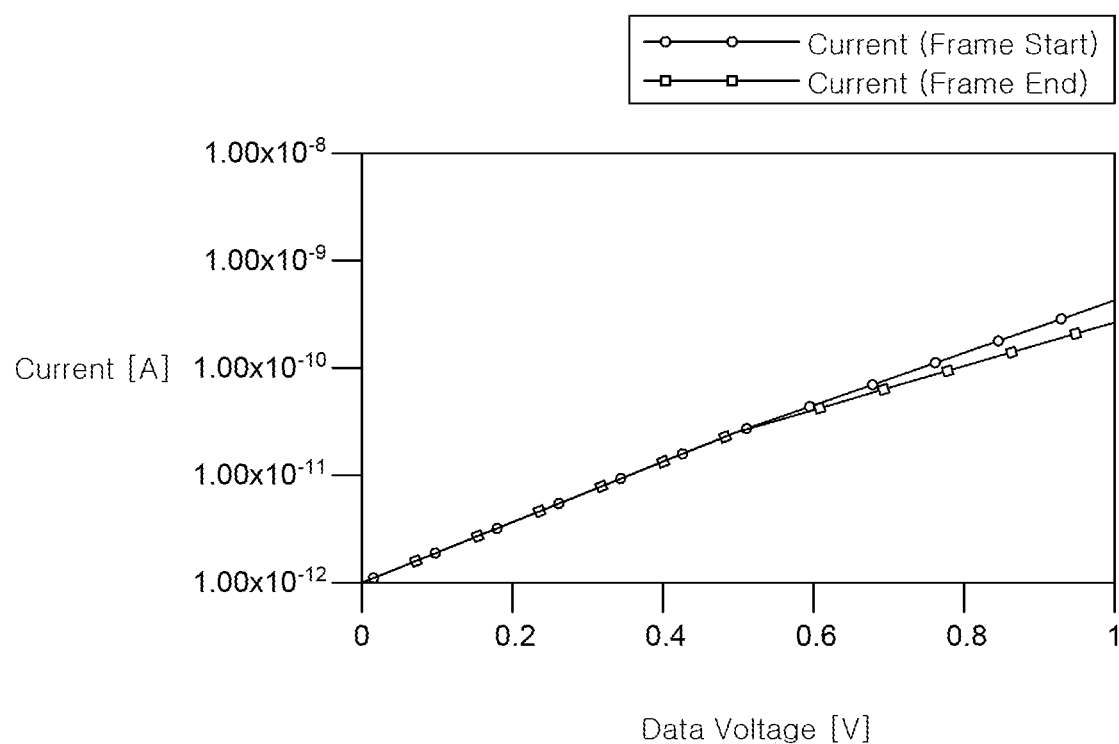
FIG. 10A is a graph illustrating a low gray-level section of a gamma curve when a shielding electrode is applied to a driving TFT, a sampling TFT, and a first initializing TFT and external light is irradiated.
Figure 10B:
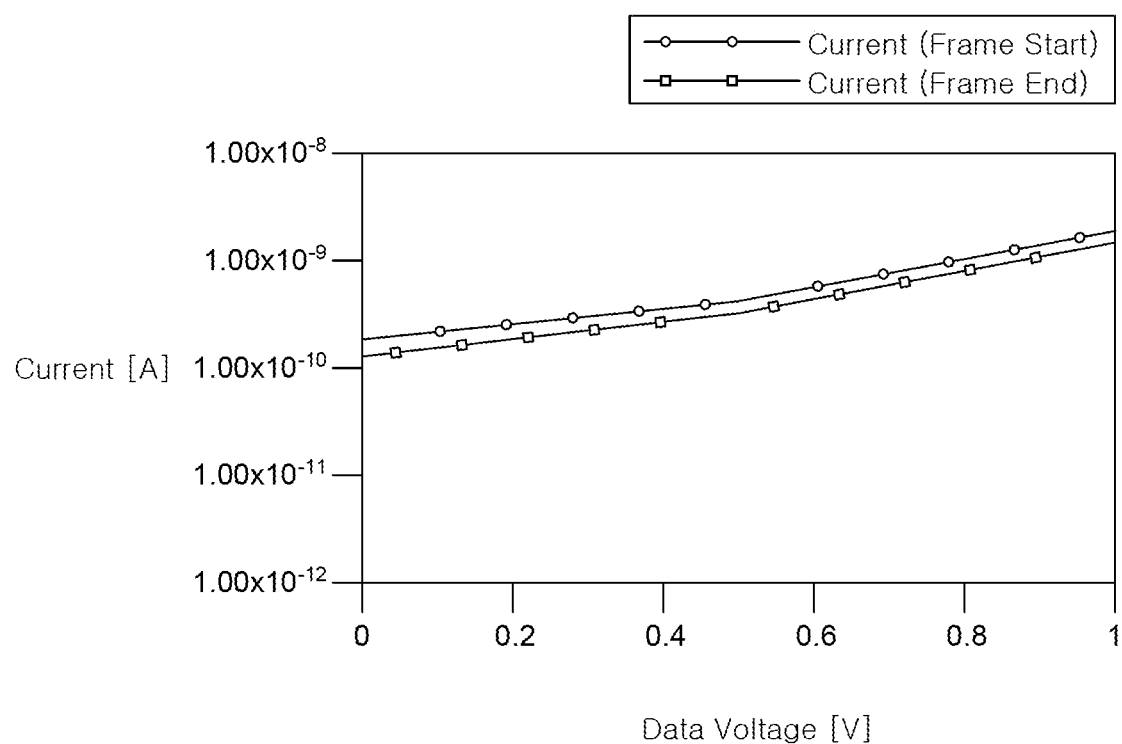
FIG. 10B is a graph illustrating a low gray-level section of a gamma curve when a shielding electrode is applied only to a sampling TFT and a first initializing TFT and external light is irradiated.

FIG. 10A is a graph illustrating a low gray-level section of a gamma curve when a shielding electrode is applied to a driving TFT, a sampling TFT, and a first initializing TFT and external light is irradiated. FIG. 10B is a graph illustrating a low gray-level section of a gamma curve when a shielding electrode is applied only to a sampling TFT and a first initializing TFT and external light is irradiated.

Referring to FIG. 10A, when a shielding electrode is applied to the driving TFT DRT, the sampling TFT SPT, and the first initializing TFT INT1, if a data voltage of 0 V is applied at a frame start timing or a frame end timing, a driving current is $1.00 \times 10^{-12}$ A or lower so that a black gray-level may be expressed.

In contrast, referring to FIG. 10B, when a shielding electrode is applied only to the sampling TFT SPT and the first initializing TFT INT1, if a data voltage of 0 V is applied at the frame start timing or the frame end timing, a driving current is $1.00 \times 10^{-10}$ A. That is, when the shielding electrode is applied only to the sampling TFT SPT and the first initializing TFT INT1, if a data voltage of 0 V is applied, the driving current is $1.00 \times 10^{-12}$ A or higher so that a full black gray-level which is a lowest gray-level may not be expressed.

In summary, when the shielding electrode is not applied to the driving TFT DRT, the black gray-level which is the lowest gray-level and the white gray-level which is the highest gray-level may not be fully expressed.

To be more specific, when the shielding electrode is not applied to the driving TFT DRT, light leakage current flows in the active layer ACT due to the external light so that the S-factor may be degraded. Therefore, due to the degraded S-factor of the driving TFT DRT, a full white gray-level which is the highest gray-level may not be expressed.

Further, when the shielding electrode is not applied to the driving TFT DRT, light leakage current flows in the active layer ACT due to the external light so that the off current Ioff may be increased. Therefore, due to the increased off current Ioff of the driving TFT DRT, a full black gray-level which is the lowest gray-level may not be expressed.

Accordingly, it is understood that even though it is exposed to the external light, in the organic light emitting display device of the present disclosure, the shielding electrode needs to be applied to the driving TFT DRT so as not to degrade the gray-level expressiveness.

Figure 11A:
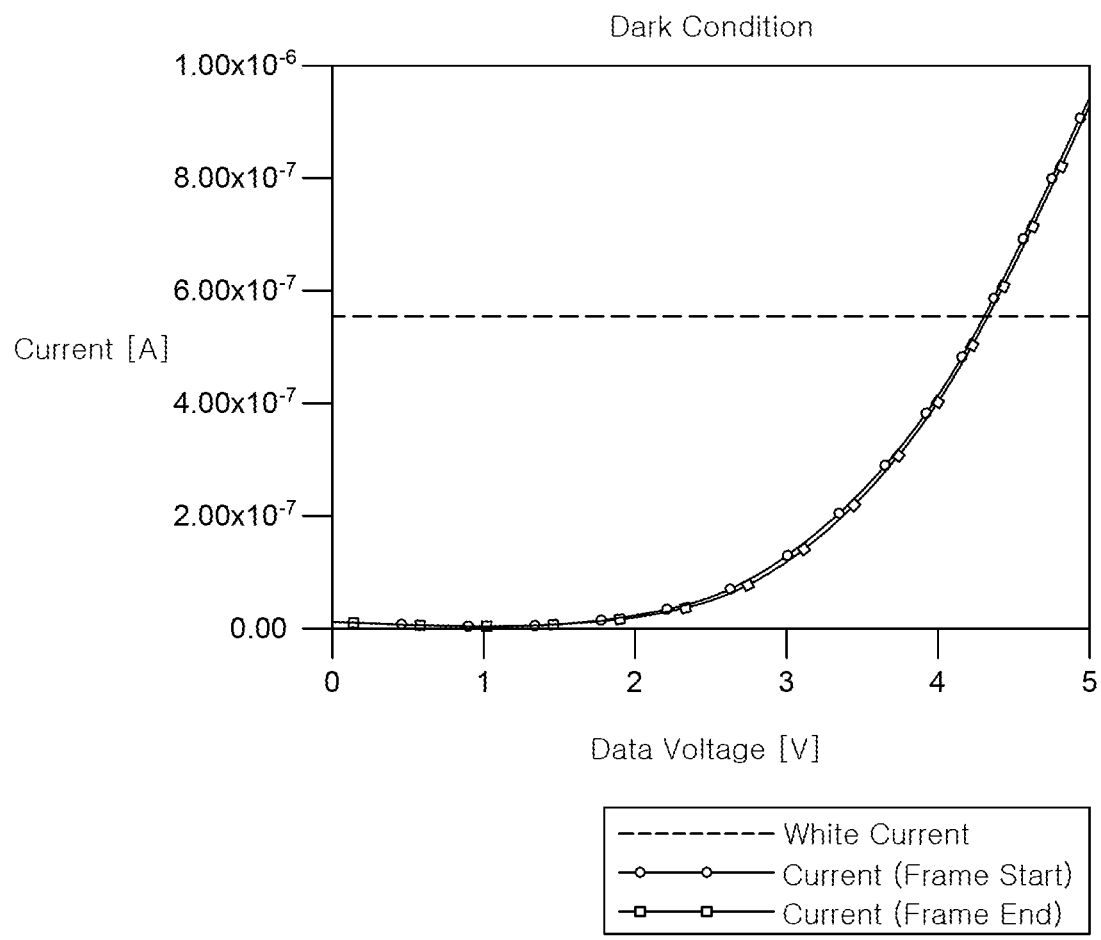
FIG. 11A is a graph illustrating a gamma curve when a shielding electrode is applied only to a driving TFT and a first initializing TFT and external light is not irradiated.
Figure 11B:
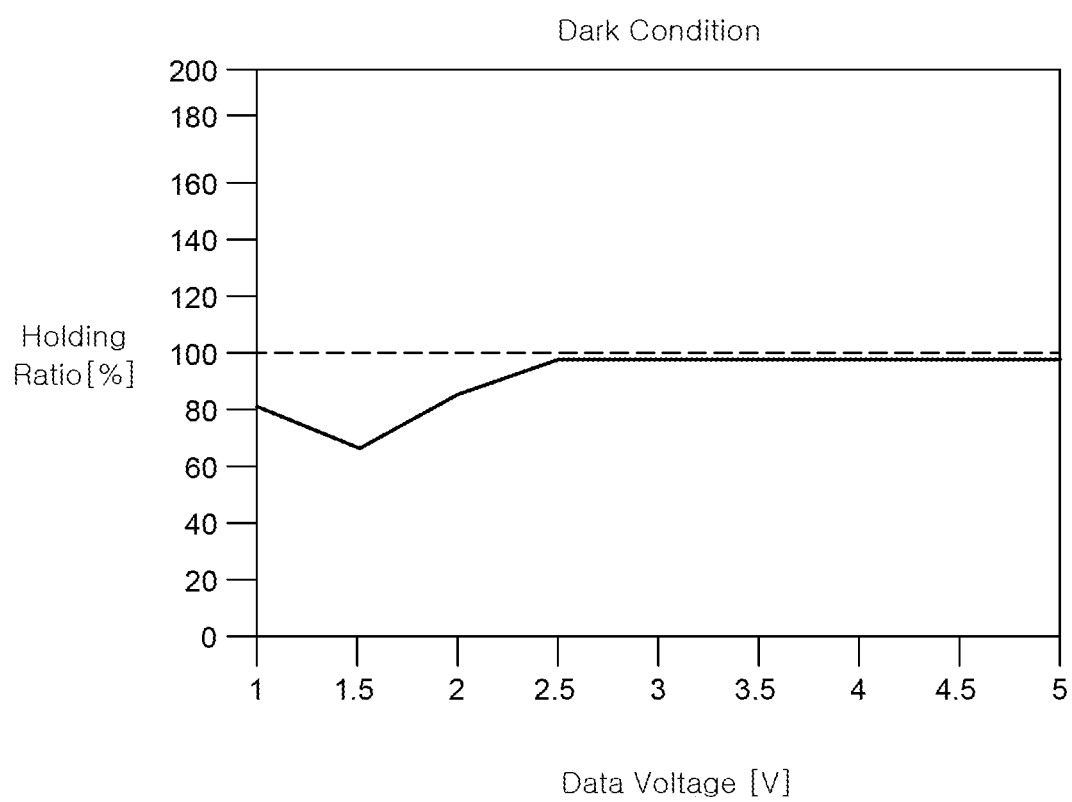
FIG. 11B is a graph illustrating a holding ratio when a shielding electrode is applied only to a driving TFT and a first initializing TFT and external light is not irradiated.
Figure 11C:
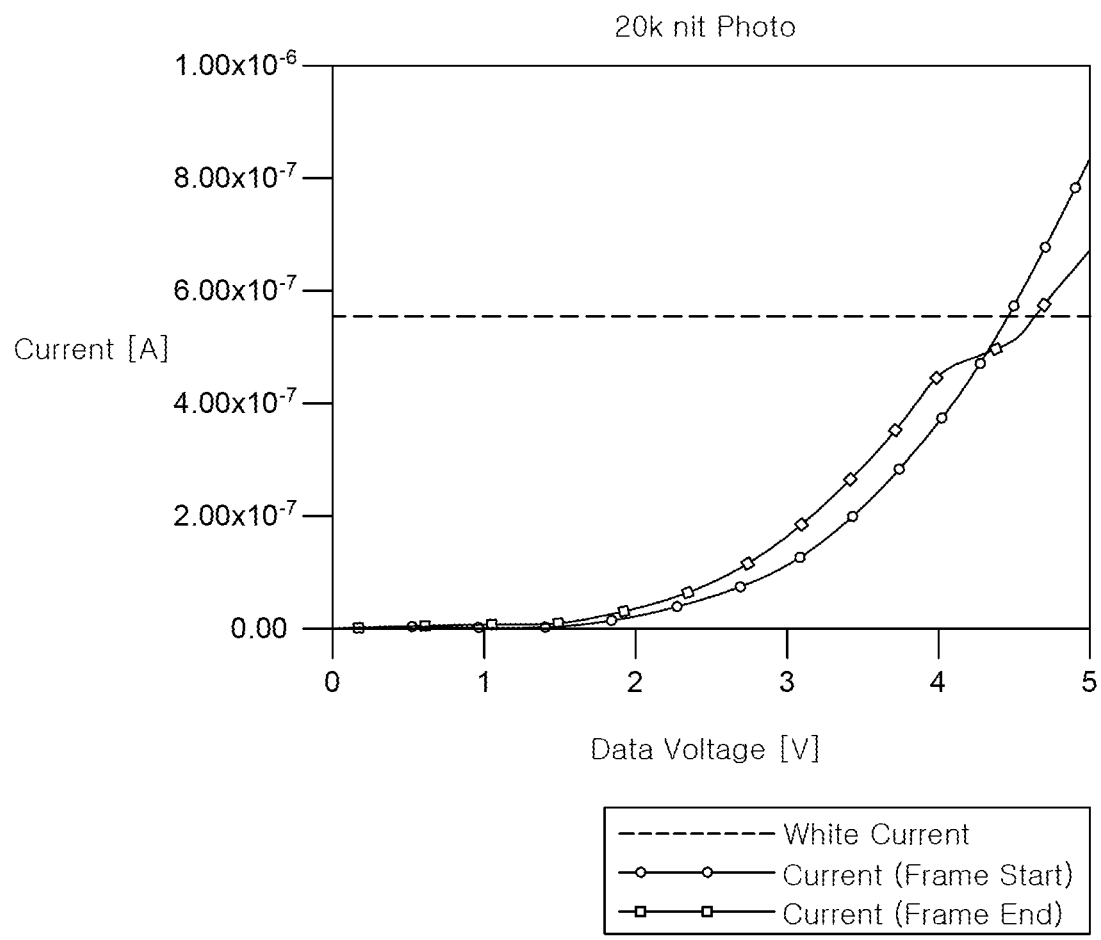
FIG. 11C is a graph illustrating a gamma curve when a shielding electrode is applied only to a driving TFT and a first initializing TFT and external light of 20,000 nits is irradiated.
Figure 11D:
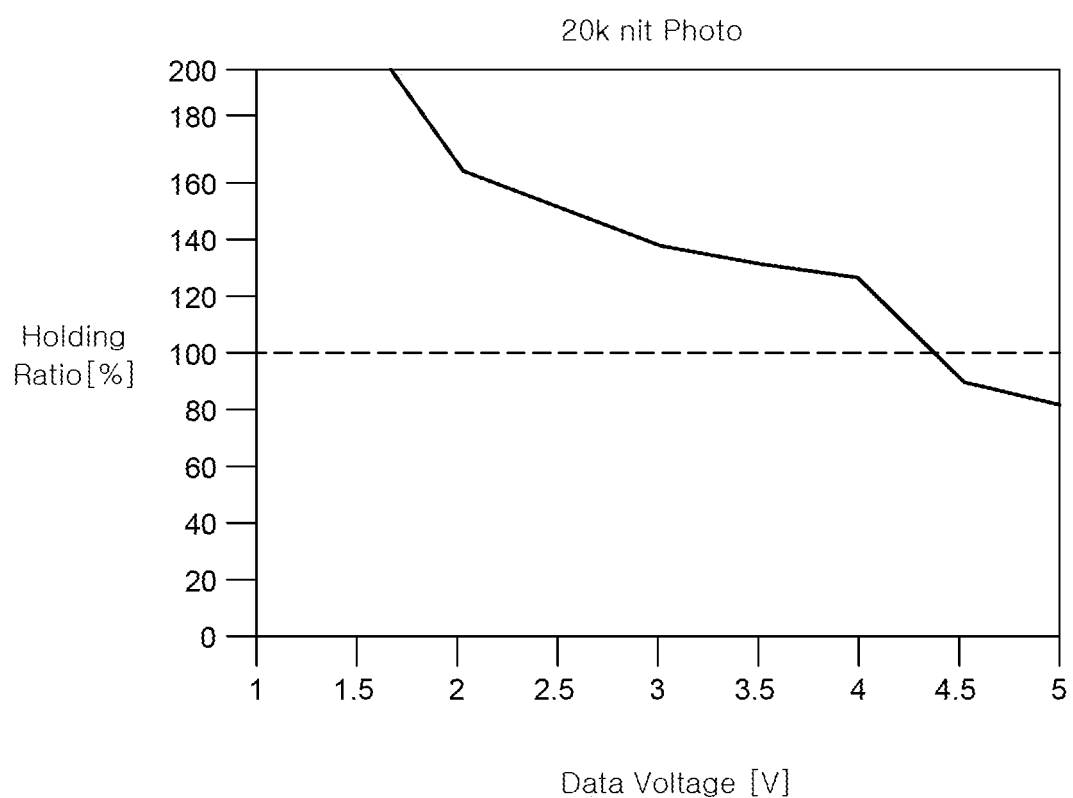
FIG. 11D is a graph illustrating a holding ratio when a shielding electrode is applied only to a driving TFT and a first initializing TFT and external light of 20,000 nits is irradiated.
Figure 11E:
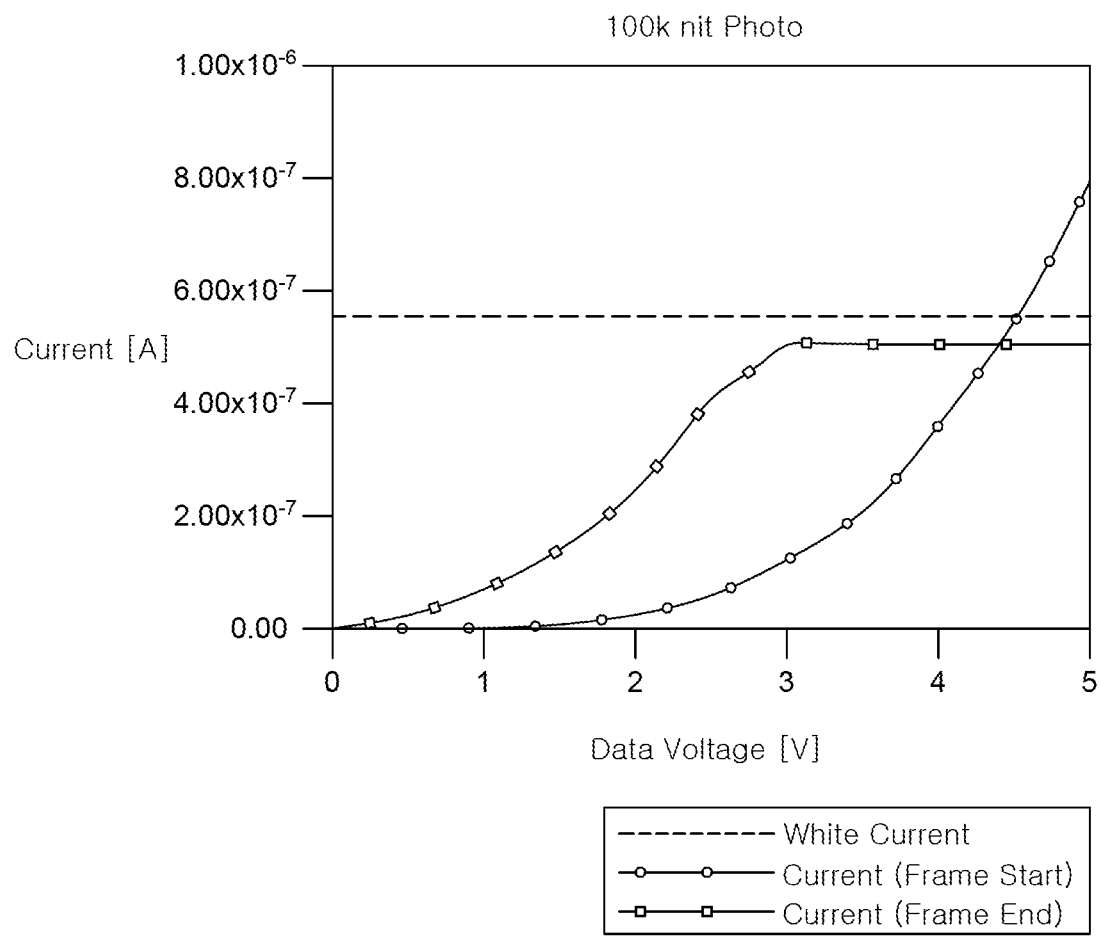
FIG. 11E is a graph illustrating a gamma curve when a shielding electrode is applied only to a driving TFT and a first initializing TFT and external light of 100,000 nits is irradiated.
Figure 11F:
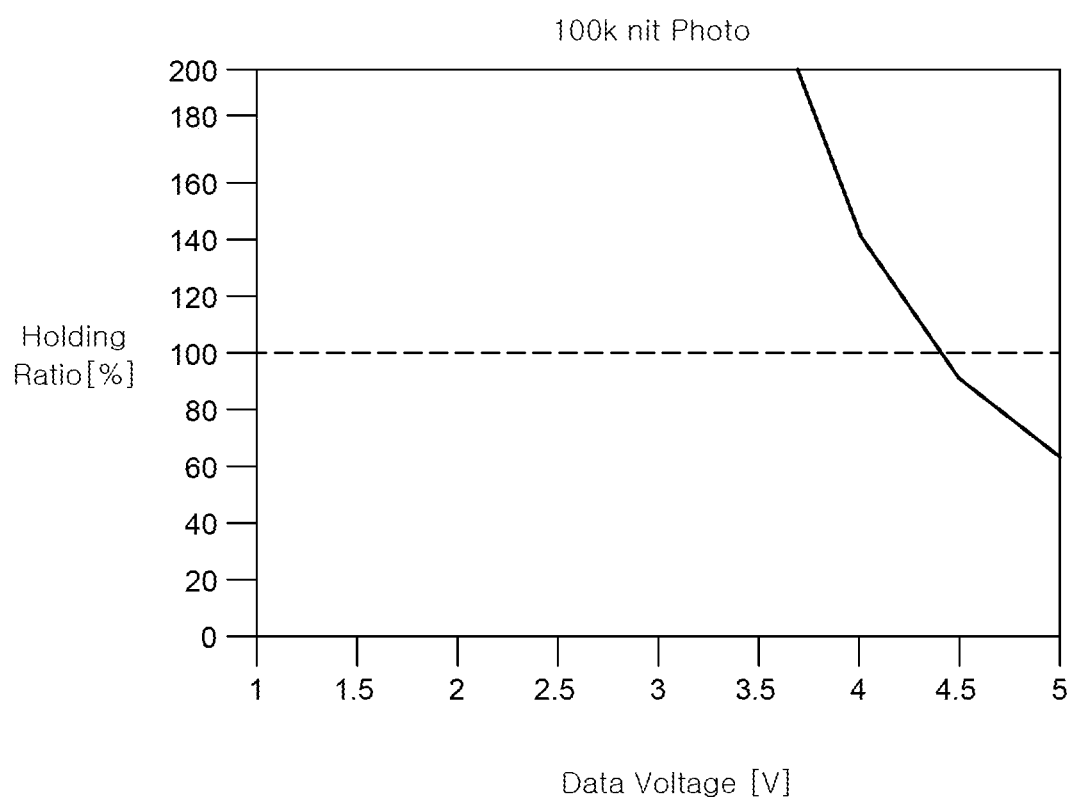
FIG. 11F is a graph illustrating a holding ratio when a shielding electrode is applied only to a driving TFT and a first initializing TFT and external light of 100,000 nits is irradiated.

FIG. 11A is a graph illustrating a gamma curve when a shielding electrode is applied only to a driving TFT and a first initializing TFT and external light is not irradiated. FIG. 11B is a graph illustrating a holding ratio when a shielding electrode is applied only to a driving TFT and a first initializing TFT and external light is not irradiated. FIG. 11C is a graph illustrating a gamma curve when a shielding electrode is applied only to a driving TFT and a first initializing TFT and external light of 20,000 nits is irradiated. FIG. 11D is a graph illustrating a holding ratio when a shielding electrode is applied only to a driving TFT and a first initializing TFT and external light of 20,000 nits is irradiated. FIG. 11E is a graph illustrating a gamma curve when a shielding electrode is applied only to a driving TFT and a first initializing TFT and external light of 100,000 nits is irradiated. FIG. 11F is a graph illustrating a holding ratio when a shielding electrode is applied only to a driving TFT and a first initializing TFT and external light of 100,000 nits is irradiated.

That is, FIGS. 11A to 11F are graphs obtained by measuring a gamma curve and a holding ratio while changing an intensity of external light in an organic light emitting display device in which a shielding electrode is applied only to a driving TFT DRT and a first initializing TFT INT1.

First, referring to FIGS. 11A, 11C, and 11E, when external light is not irradiated or even though external light of 20,000 nits or 100,000 nits is irradiated, if a data voltage of 0 V is applied at a frame start timing, a driving current is $1.00 \times 10^{-12}$ A or lower. Therefore, a black gray-level may be expressed. Further, when the data voltage of 5 V is applied, a driving current is $6.00 \times 10^{-7}$ A or higher, so that a white gray-level may be expressed. That is, when external light is not irradiated or even though external light of 20,000 nits or 100,000 nits is irradiated, all gray-levels may be expressed at the frame start timing.

Further, referring to FIG. 11B, when external light is not irradiated, a holding ratio which is a ratio of a driving current at the frame start timing and a driving current of the frame end timing is maintained at almost 100%. Therefore, when the external light is not irradiated, a gray-level expressed during one frame may be stably maintained.

Further, referring to FIG. 11D, when external light of 20,000 nits is irradiated, a holding ratio which is a ratio of a driving current at the frame start timing and a driving current of the frame end timing is changed from almost 200% to 80%. Therefore, when external light of 20,000 nits is irradiated, there is a problem in that a gray-level expressed for one frame is consistently changed.

Further, referring to FIG. 11F, when external light of 100,000 nits is irradiated, a holding ratio which is a ratio of a driving current at the frame start timing and a driving current of the frame end timing is continuously changed. Therefore, even though external light of 100,000 nits is irradiated, there is a problem in that a gray-level expressed for one frame is consistently changed.

That is, as illustrated in FIGS. 11A to 11F, it is understood that when the shielding electrode is not applied to the sampling TFT SPT, if the external light is irradiated, a holding ratio which is a ratio of a driving current at the frame starting timing and a driving current at the frame end timing is changed. Moreover, it is understood that when the intensity of the external light is increased from 20,000 nits to 100,000 nits, the holding ratio is more sharply changed.

To be more specific, when the shielding electrode is not applied to the sampling TFT SPT, light leakage current flows in the active layer ACT due to the external light so that the off current Ioff may be increased. Therefore, the voltage is not maintained in the second node N2 which is a drain electrode of the sampling TFT SPT for one frame, due to the increased off current Ioff of the sampling TFT SPT. As a result, a gate-source voltage Vgs of the driving TFT DRT which is connected to the second node N2 is changed and a driving current is changed so that the holding ratio is not constantly maintained.

Therefore, it is understood that even though it is exposed to the external light, in the organic light emitting display device of the present disclosure, the shielding electrode needs to be applied to the sampling TFT SPT so as not to lower the holding ratio which is a ratio of the driving current at the frame starting timing and a driving current at the frame end timing.

Figure 12:
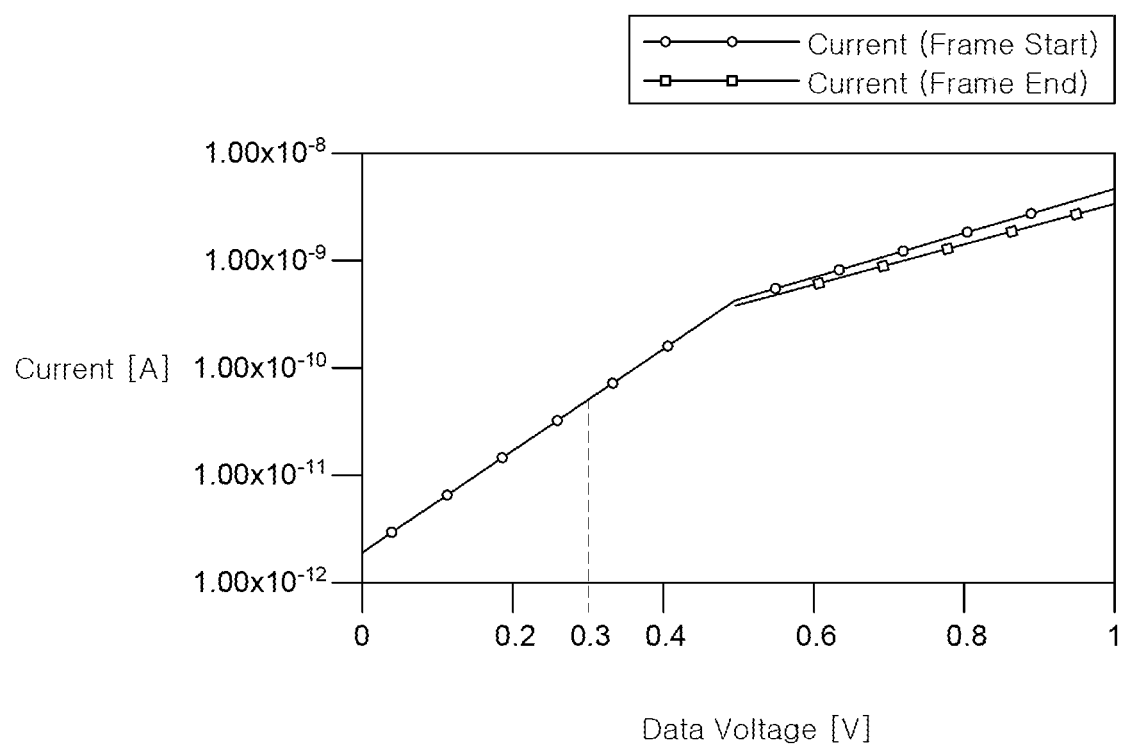
FIG. 12 is a graph illustrating a low gray-level section of a gamma curve when a shielding electrode is applied only to a driving TFT and a sampling TFT and external light is irradiated.

FIG. 12 is a graph illustrating a low gray-level section of a gamma curve when a shielding electrode is applied only to a driving TFT and a sampling TFT and external light is irradiated.

Referring to FIG. 10A, when a shielding electrode is applied to the driving TFT DRT, the sampling TFT SPT, and the first initializing TFT INT1, if a data voltage of 0 V is applied at a frame start timing or a frame end timing, a driving current is $1.00 \times 10^{-12}$ A or lower so that a black gray-level may be expressed.

In contrast, referring to FIG. 12, when a shielding electrode is applied only to the driving TFT DRT and the sampling TFT SPT, if a data voltage of 0.3 V is applied at the frame start timing or the frame end timing, a driving current is $1.00 \times 10^{-10}$ A. That is, when the shielding electrode is applied only to the driving TFT DRT and the sampling TFT SPT, if the data voltage of 0 V to 0.3 V is applied, the driving current is $1.00 \times 10^{-10}$ A or lower so that distortion is generated in a low gray-level region.

In summary, when the shielding electrode is not applied to the first initializing TFT INT1, the driving current is lowered for a low gray-level section so that the low gray-level region is distorted.

To be more specific, when the shielding electrode is not applied to the first initializing TFT INT1, light leakage current flows in the active layer ACT due to the external light so that the off current Ioff may be increased. Therefore, due to the increased off current Ioff of the first initializing TFT INTL there is a problem in that a driving current which needs to be applied to the organic light emitting diode OD is leaked through the first initializing TFT INT1.

Accordingly, it is understood that even though it is exposed to the external light, in the organic light emitting display device of the present disclosure, the shielding electrode needs to be applied to the first initializing TFT INT1 so as not to cause a distortion of the low gray-level region.

Hereinafter, an organic light emitting display device according to another embodiment of the present disclosure will be described. The organic light emitting display device according to another embodiment of the present disclosure may have a different pixel circuit structure from the organic light emitting display device according to the y embodiment of the present disclosure. Therefore, repeated contents of the organic light emitting display device according to another embodiment of the present disclosure and the organic light emitting display device according to the embodiment of the present disclosure are omitted and a structure of the pixel circuit will be mainly described.

Hereinafter, an example that the organic light emitting display device according to another embodiment of the present disclosure includes a 4T2C pixel circuit PC will be described in detail with reference to FIG. 13.

Structure of 4T2C Pixel Circuit

Figure 13:
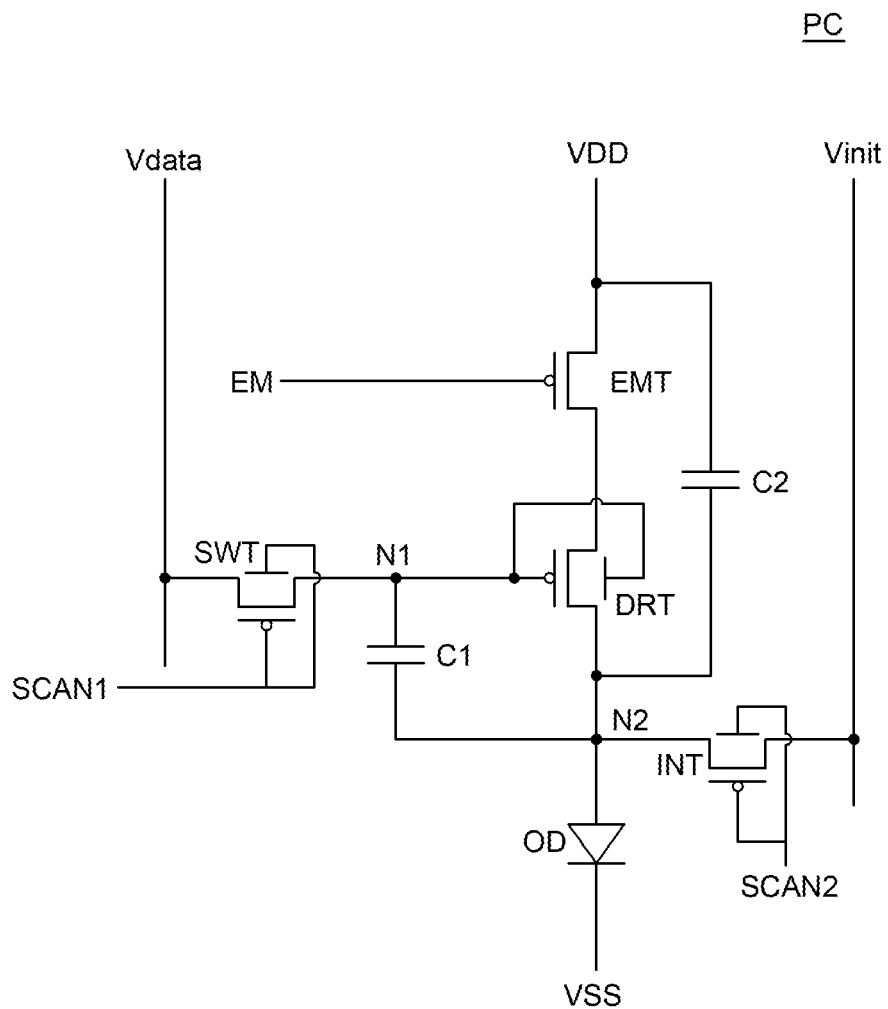
FIG. 13 is a circuit diagram illustrating a 4T2C pixel circuit equipped in an organic light emitting display device according to another embodiment of the present disclosure.

FIG. 13 is a circuit diagram illustrating a 4T2C pixel circuit equipped in an organic light emitting display device according to another embodiment of the present disclosure.

For reference, even though in FIG. 13, the plurality of TFTs is n-type TFTs, the present disclosure is not limited thereto and the plurality of TFTs may be p-type TFTs.

Referring to FIG. 13, a pixel circuit PC according to another embodiment of the present disclosure includes a driving TFT DRT, a switching TFT SWT, an emission control TFT EMT, an initializing transistor INT, a first capacitor C1, and a second capacitor C2.

The driving TFT DRT controls a driving current which is supplied to the organic light emitting diode OD.

The driving TFT DRT may include a source electrode, an active layer, a drain electrode, a gate electrode, and a shielding electrode. Specifically, in the driving TFT DRT, the source electrode is connected to the emission control TFT (EMT), the drain electrode is connected to a second node N2, the gate electrode is connected to a first node N1, and the shielding electrode is connected to the gate electrode.

Therefore, a driving current supplied to the organic light emitting diode OD is controlled in accordance with a gate-source voltage Vgs of the driving TFT DRT to control a luminance of the organic light emitting diode OD in accordance with a driving current amount.

The switching TFT SWT applies a data voltage Vdata supplied from the data line to the first node N1.

The switching TFT SWT may include a source electrode, an active layer, a drain electrode, a gate electrode, and a shielding electrode. Specifically, in the switching TFT SWT, a data voltage Vdata is input to the source electrode, the drain electrode is connected to the first node N1, a first scan signal SCAN1 is input to the gate electrode, and the shielding electrode is connected to the gate electrode.

Therefore, the switching TFT SWT applies a data voltage Vdata supplied from the data line to the first node N1 in response to the first scan signal SCAN1.

The emission control TFT EMT controls the emission of the organic light emitting diode OD.

The emission control TFT EMT may include a source electrode, an active layer, a drain electrode, and a gate electrode. Specifically, in the emission control TFT EMT, the source electrode is connected to an input terminal of the high potential voltage VDD, the drain electrode is connected to the organic light emitting diode OD, and the emission control signal EM is input to the gate electrode.

Therefore, the emission control TFT EMT forms a current path between the input terminal of the high potential voltage VDD and the organic light emitting diode OD in response to the emission control signal EM to control the emission of the organic light emitting diode OD.

The initializing TFT INT applies an initialization voltage Vinit to the organic light emitting diode OD.

The initializing TFT INT may include a source electrode, an active layer, a drain electrode, a gate electrode, and a shielding electrode. Specifically, in the initializing TFT INT, the source electrode is connected to an input terminal of the initialization voltage Vinit, the drain electrode is connected to the organic light emitting diode OD, the second scan signal SCAN2 is input to the gate electrode, and the shielding electrode is connected to the gate electrode.

Therefore, the initializing TFT INT applies an initialization voltage Vinit to the organic light emitting diode OD in response to the second scan signal SCAN2.

The first capacitor C1 is connected between the first node N1 and the second node N2 to store a different voltage between two terminals. The first capacitor C1 samples a threshold voltage of the driving TFT DRT by a source-follower manner.

The second capacitor C2 is connected between the input terminal of the high potential voltage VDD and the second node N2. When a potential of the first node N1 is changed in accordance with a data voltage Vdata, the first and second capacitors C1 and C2 divide a voltage change to reflect the voltage change to the second node N2.

As described above, the pixel circuit PC of the organic light emitting display device according to another embodiment of the present disclosure may have a 4T2C structure. Specifically, among the plurality of TFTs, the driving TFT DRT, the switching TFT SWT, and the initializing TFT INT include the gate electrode and the shielding electrode which are electrically connected with each other.

In other words, the driving TFT DRT, the switching TFT SWT, and the initializing TFT INT may be dual gate TFTs which include the gate electrode and the shielding electrode which are electrically connected with each other.

However, the present disclosure is not limited thereto and any one or more of the driving TFT DRT, the switching TFT SWT, and the initializing TFT INT may be a dual gate TFT depending on the necessity of design.

By doing this, in the active layer, a front channel layer due to the gate electrode and a back channel layer due to the shielding electrode are formed. That is, in the driving TFT DRT, the switching TFT SWT, and the initializing TFT INT, two stable channel layers may be formed in the active layer. As a result, the turn-on current is stabilized and the S-factor is increased so that the TFT driving characteristic may be improved.

Further, when the shielding electrode is not applied to the driving TFT DRT, the black gray-level which is the lowest gray-level and the white gray-level which is the highest gray-level may not be fully expressed.

To be more specific, when the shielding electrode is not applied to the driving TFT DRT, light leakage current flows in the active layer ACT due to the external light so that the S-factor may be degraded. Therefore, due to the degraded S-factor of the driving TFT DRT, a full white gray-level which is the highest gray-level may not be expressed.

Further, when the shielding electrode is not applied to the driving TFT DRT, light leakage current flows in the active layer ACT due to the external light so that the off current Ioff may be increased. Therefore, due to the increased off current Ioff of the driving TFT DRT, a full black gray-level which is the lowest gray-level may not be expressed.

Accordingly, it is understood that even though it is exposed to the external light, in the organic light emitting display device of the present disclosure, the shielding electrode need to be applied to the driving TFT DRT so as not to degrade the gray-level expressiveness.

Further, when the shielding electrode is not applied to the initializing TFT INT, the driving current is lowered during a low gray-level section so that distortion may be caused in the low gray-level region.

To be more specific, when the shielding electrode is not applied to the initializing TFT INT, light leakage current flows in the active layer ACT due to the external light so that the off current Ioff may be increased. Therefore, due to the off current Ioff of the initializing TFT INT, there is a problem in that a driving current which needs to be applied to the organic light emitting diode OD is leaked through the initializing TFT INT.

Accordingly, it is understood that even though it is exposed to the external light, the organic light emitting display device of the present disclosure needs to apply the shielding electrode to the initializing TFT INT so as not to cause a distortion of the low gray-level region.

Further, when the shielding electrode is not applied to the switching TFT SWT, if external light is irradiated, a holding ratio which is a ratio of a driving current of a frame start point and a driving current of a frame end timing is changed.

To be more specific, when the shielding electrode is not applied to the switching TFT SWT, light leakage current flows in the active layer ACT due to the external light so that the off current Ioff may be increased. Therefore, the voltage is not maintained in the first node N1 which is a drain electrode of the switching TFT SWT for one frame, due to the increased off current Ioff of the switching TFT SWT. As a result, a gate-source voltage Vgs of the driving TFT DRT which is connected to the first node N1 is changed and a driving current is changed so that the holding ratio is not constantly maintained.

Therefore, even though it is exposed to the external light, in the organic light emitting display device of the present disclosure, the shielding electrode needs to be applied to the switching TFT SWT so as not to lower the holding ratio which is a ratio of the driving current at the frame starting timing and a driving current at the frame end timing.

The embodiments of the present disclosure can also be described as follows:

According to an aspect of the present disclosure, an organic light emitting display device includes a display panel including a plurality of pixels disposed on a substrate, and each of the plurality of pixels includes an organic light emitting diode and a pixel circuit which controls the driving of the organic light emitting diode. The pixel circuit includes: a driving TFT which supplies a driving current to the organic light emitting diode; a sampling TFT which samples a threshold voltage of the driving TFT; a first initializing TFT which supplies an initialization voltage to one electrode of the organic light emitting diode; and a storage capacitor which stores a voltage applied to the driving TFT, and at least one of the driving TFT, the sampling TFT, and the first initializing TFT includes a shielding electrode disposed between the substrate and the active layer. Therefore, even though the external light is irradiated onto a transparent substrate, a full white gray-level and a full black gray-level can be expressed so that the gray-level expressiveness may not be degraded.

The shielding electrode of the driving TFT may be electrically connected to a gate electrode of the driving TFT.

The shielding electrode of the sampling TFT may be electrically connected to a gate electrode of the sampling TFT.

The shielding electrode of the first initializing TFT may be electrically connected to a gate electrode of the first initializing TFT.

The active layer may be made of a low temperature poly-silicon.

A width of the shielding electrode may be larger than a width of the active layer.

A distance between an end of the shielding electrode and an end of the active layer may be 2 μm to 8 μm.

A thickness of the shielding electrode may be 1,000 Å to 2,000 Å.

The pixel circuit may include an emission control TFT which controls emission of the organic light emitting diode, a switching TFT which applies a data voltage to the storage capacitor and a second initializing TFT which applies the initialization voltage to the storage capacitor.

In each of the plurality of pixels, a transmission area where light may be transmitted and an emission area where the pixel circuit and the organic light emitting diode are disposed are included, and in the emission area, the pixel circuit may be disposed between the shielding electrode and the organic light emitting diode.

According to another aspect of the present disclosure, an organic light emitting display device includes an organic light emitting diode formed over a substrate and a pixel circuit which controls the driving of the organic light emitting diode. The pixel circuit includes: a driving TFT which may be connected to one electrode of the organic light emitting diode; a switching TFT which may be connected to a gate electrode of the driving TFT and a data line; and an initializing TFT which may be connected to one electrode of the organic light emitting diode and an input terminal of an initialization voltage. At least one of the driving TFT, the switching TFT, and the initializing TFT includes a gate electrode disposed above the active layer and a shielding electrode disposed below the active layer. Therefore, even though external light may be irradiated, a gray-level expressed for one frame may be constantly maintained.

The shielding electrode of the driving TFT may be electrically connected to the gate electrode of the driving TFT.

The shielding electrode of the driving TFT may be electrically connected to the gate electrode of the driving TFT.

The shielding electrode of the initializing TFT may be electrically connected to the gate electrode of the initializing TFT.

The active layer may be made of a low temperature poly-silicon.

A width of the shielding electrode may be larger than a width of the active layer.

A distance between an end of the shielding electrode and an end of the active layer may be 2 μm to 8 μm.

A thickness of the shielding electrode may be 1,000 Å to 2,000 Å.

The pixel circuit may include a first capacitor connected to the gate electrode of the driving TFT and a drain electrode of the driving TFT; an emission control TFT which may be connected to a source electrode of the driving TFT and the input terminal of a high potential voltage; and a second capacitor connected to a drain electrode of the driving TFT and the input terminal of the high potential voltage.

The organic light emitting display device may include a transmission area and an emission area, and in the emission area, the pixel circuit may be disposed between the shielding electrode and the organic light emitting diode.

Further aspect of the present disclosure includes the organic light emitting display device including a display panel including a substrate and a plurality of pixels disposed on the substrate. Each of the plurality of pixels includes an organic light emitting diode and a pixel circuit which controls the driving of the organic light emitting diode.

In one or more embodiments, the pixel circuit includes: a driving thin film transistor (TFT) which supplies a driving current to the organic light emitting diode, the driving TFT having a driving active layer; a sampling TFT which samples a threshold voltage of the driving TFT, the sampling TFT having a sampling active layer; a first initializing TFT which supplies an initialization voltage to one electrode of the organic light emitting diode, the first initializing TFT having an initializing active layer; and a storage capacitor which stores a voltage applied to the driving TFT.

In one or more embodiments, at least one of the driving TFT, the sampling TFT, and the first initializing TFT includes a shielding electrode as a transistor component. The shielding electrode is disposed between the substrate and the respective an active layer of at least one of the driving TFT, the sampling TFT, and the first initializing TFT.

In one or more embodiments, the shielding electrode of the driving TFT is electrically connected to the gate electrode of the driving TFT. The shielding electrode acts as a back gate electrode to the driving TFT.

In one or more embodiments, the shielding electrode of the sampling TFT is electrically connected to the gate electrode of the sampling TFT. The shielding electrode acts as a back gate electrode to the sampling TFT.

In one or more embodiments, the shielding electrode of the first initializing TFT is electrically connected to the gate electrode of the first initializing TFT. The shielding electrode acting as a back gate electrode to the first initializing TFT.

Another aspect of the present disclosure includes an organic light emitting display device including: a substrate; an organic light emitting diode on the substrate, and a pixel circuit configured to control the driving of the organic light emitting diode.

In one or more embodiments, the pixel circuit includes a driving thin film transistor (TFT) which is connected to one electrode of the organic light emitting diode. The driving TFT has a driving active layer.

The pixel circuit includes a switching TFT which is connected to a gate electrode of the driving TFT and a data line. The switching TFT has a switching active layer.

The pixel circuit includes an initializing TFT which is connected to the one electrode of the organic light emitting diode and an input terminal of an initialization voltage. The initializing TFT has an initializing active layer.

In one or more embodiments, at least one of the driving TFT, the switching TFT, and the initializing TFT includes a shielding electrode as a transistor component. The shielding electrode is disposed below the respective active layer of at least one of the driving TFT, the switching TFT, and the initializing TFT, and a gate electrode is disposed above the respective active layer of the pixel circuit.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a display panel including a substrate and a plurality of pixels disposed on the substrate,
wherein each of the plurality of pixels includes an organic light emitting diode and a pixel circuit which controls the driving of the organic light emitting diode,
the pixel circuit includes:
a driving thin film transistor (TFT) which supplies a driving current to the organic light emitting diode, the driving TFT having a driving active layer;
a sampling TFT which samples a threshold voltage of the driving TFT, the sampling TFT having a sampling active layer;
a first initializing TFT which supplies an initialization voltage to one electrode of the organic light emitting diode, the first initializing TFT having an initializing active layer; and
a storage capacitor which stores a voltage applied to the driving TFT, and
at least one of the driving TFT, the sampling TFT, and the first initializing TFT includes a shielding electrode as a transistor component, the shielding electrode being disposed between the substrate and a respective active layer of at least one of the driving TFT, the sampling TFT, and the first initializing TFT,
wherein the shielding electrode is overlapped with the respective active layer of at least one of the driving TFT, the sampling TFT, and the first initializing TFT.

2. The organic light emitting display device according to claim 1, wherein the shielding electrode of the driving TFT is electrically connected to the gate electrode of the driving TFT, the shielding electrode acting as a back gate electrode to the driving TFT.

3. The organic light emitting display device according to claim 1, wherein the shielding electrode of the sampling TFT is electrically connected to the gate electrode of the sampling TFT, the shielding electrode acting as a back gate electrode to the sampling TFT.

4. The organic light emitting display device according to claim 1, wherein the shielding electrode of the first initializing TFT is electrically connected to the gate electrode of the first initializing TFT, the shielding electrode acting as a back gate electrode to the first initializing TFT.

5. The organic light emitting display device according to claim 1, wherein the active layer is made of a low temperature poly-silicon.

6. The organic light emitting display device according to claim 1,
wherein a width of the shielding electrode is larger than a width of the active layer, and
wherein a distance between an end of the shielding electrode and an end of the active layer is 2 μm to 8 μm.

7. The organic light emitting display device according to claim 1, wherein a thickness of the shielding electrode is 1,000 Å to 2,000 Å.

8. The organic light emitting display device according to claim 1, wherein the pixel circuit further includes:
an emission control TFT which controls emission of the organic light emitting diode;
a switching TFT which applies a data voltage to the storage capacitor; and
a second initializing TFT which applies the initialization voltage to the storage capacitor.

9. The organic light emitting display device according to claim 1,
wherein each of the plurality of pixels includes a transmission area where light is transmitted and an emission area where the pixel circuit and the organic light emitting diode are disposed, and
in the emission area, the pixel circuit is disposed between the substrate and the organic light emitting diode.

10. The organic light emitting display device according to claim 1, two channel layers are formed in the active layer.

11. An organic light emitting display device, comprising:
a substrate;
an organic light emitting diode on the substrate, and
a pixel circuit configured to control the organic light emitting diode, wherein the pixel circuit includes:
a driving thin film transistor (TFT) which is connected to one electrode of the organic light emitting diode, the driving TFT having a driving active layer;
a switching TFT which is connected to a gate electrode of the driving TFT and a data line, the switching TFT having a switching active layer; and
an initializing TFT which is connected to the one electrode of the organic light emitting diode and an input terminal of an initialization voltage, the initializing TFT having an initializing active layer, and
wherein at least one of the driving TFT, the switching TFT, and the initializing TFT includes:
a shielding electrode as a transistor component, the shielding electrode being disposed below a respective active layer of at least one of the driving TFT, the switching TFT, and the initializing TFT; and
a gate electrode disposed above the respective active layer of the pixel circuit,
wherein the shielding electrode is overlapped with the respective active layer of at least one of the driving TFT, the sampling TFT, and the initializing TFT.

12. The organic light emitting display device according to claim 11, wherein the shielding electrode of the driving TFT is electrically connected to the gate electrode of the driving TFT.

13. The organic light emitting display device according to claim 11, wherein the shielding electrode of the switching TFT is electrically connected to the gate electrode of the switching TFT.

14. The organic light emitting display device according to claim 11, wherein the shielding electrode of the initializing TFT is electrically connected to the gate electrode of the initializing TFT.

15. The organic light emitting display device according to claim 11, wherein the active layer is made of a low temperature poly-silicon.

16. The organic light emitting display device according to claim 11,
wherein a width of the shielding electrode is larger than a width of the active layer, and
wherein a distance between an end of the shielding electrode and an end of the active layer is substantially about 2 μm to 8 μm.

17. The organic light emitting display device according to claim 11, wherein a thickness of the shielding electrode is substantially about 1,000 Å to 2,000 Å.

18. The organic light emitting display device according to claim 11, wherein the pixel circuit further includes:
a first capacitor connected to the gate electrode of the driving TFT and a drain electrode of the driving TFT;
an emission control TFT which is connected to a source electrode of the driving TFT and the input terminal of a high potential voltage; and
a second capacitor connected to a drain electrode of the driving TFT and the input terminal of the high potential voltage.

19. The organic light emitting display device according to claim 11, wherein the organic light emitting display device further includes a transmission area and an emission area, and in the emission area, the pixel circuit is disposed between the substrate and the organic light emitting diode.

20. The organic light emitting display device according to claim 11, two channel layers are formed in the active layer.

* * * * *